(12) United States Patent
Diorio et al.

(10) Patent No.: US 7,061,324 B2
(45) Date of Patent: Jun. 13, 2006

(54) USE OF ANALOG-VALUED FLOATING-GATE TRANSISTORS FOR PARALLEL AND SERIAL SIGNAL PROCESSING

(75) Inventors: Christopher J. Diorio, Shoreline, WA (US); Todd E. Humes, Shoreline, WA (US); Ronald A. Oliver, Seattle, WA (US); William T. Colleran, Seattle, WA (US); Scott A. Cooper, Seattle, WA (US)

(73) Assignee: Impinj, Inc., Seattle, WA (US)

( * ) Notice: Subject to any disclaimer, the term of this patent is extended or adjusted under 35 U.S.C. 154(b) by 0 days.

(21) Appl. No.: 11/055,959

(22) Filed: Feb. 10, 2005

(65) Prior Publication Data

US 2005/0200417 A1 Sep. 15, 2005

Related U.S. Application Data

(62) Division of application No. 10/268,116, filed on Oct. 8, 2002.

(51) Int. Cl.
*H03F 3/16* (2006.01)

(52) U.S. Cl. .................................................. 330/277

(58) Field of Classification Search ................ 330/264, 330/277, 295, 307
See application file for complete search history.

(56) References Cited

U.S. PATENT DOCUMENTS

| | | | |
|---|---|---|---|
| 4,163,947 A | 8/1979 | Weedon | 327/341 |
| 4,240,068 A | 12/1980 | Handy | 340/347 |
| 4,259,582 A | 3/1981 | Albert | 378/98.6 |
| 4,272,759 A | 6/1981 | Handy | 341/133 |
| 4,472,648 A | 9/1984 | Prentice | 307/571 |
| 4,763,105 A | 8/1988 | Jenq | 341/120 |
| 4,783,783 A | 11/1988 | Nagai et al. | 714/17 |
| 4,851,792 A | 7/1989 | Ochiai et al. | 331/176 |
| 4,935,702 A * | 6/1990 | Mead et al. | 365/185.32 |
| 4,958,123 A | 9/1990 | Hughes | 323/316 |
| 4,962,380 A | 10/1990 | Meadows | 341/120 |
| 5,166,562 A | 11/1992 | Allen et al. | 307/571 |
| 5,177,697 A | 1/1993 | Schanen et al. | 364/571.04 |
| 5,243,347 A | 9/1993 | Jackson et al. | 341/144 |
| 5,270,963 A | 12/1993 | Allen et al. | 364/861 |
| 5,296,752 A | 3/1994 | Groeneveld et al. | 327/91 |
| 5,543,791 A | 8/1996 | Riggio, Jr. | 341/101 |
| 5,557,272 A | 9/1996 | Riggio, Jr. | 341/100 |
| 5,627,392 A | 5/1997 | Diorio et al. | 257/315 |
| 5,666,118 A | 9/1997 | Gersbach | 341/120 |

(Continued)

FOREIGN PATENT DOCUMENTS

EP  0 298 618  1/1989

OTHER PUBLICATIONS

Bastos, et al., "A 12-bit Intrinsic Accuracy High-Speed CMOS DAC", IEEE Journal of Solid-State Circuits, vol. 33, No. 12, Dec. 1998, pp. 1959-1969.

(Continued)

*Primary Examiner*—Steven J. Mottola
(74) *Attorney, Agent, or Firm*—Thelen Reid & Priest LLP; David B. Ritchie

(57) ABSTRACT

Analog-valued floating-gate transistors are used as trimmable circuit components for modifying and/or controlling the gain, phase, offset, frequency response, current consumption, and/or transfer function of signal pathways in parallel and/or serial processing circuits in radio frequency, analog, or mixed-signal integrated circuits.

11 Claims, 21 Drawing Sheets

U.S. PATENT DOCUMENTS

| | | | |
|---|---|---|---|
| 5,684,738 A | 11/1997 | Au et al. | 365/185.03 |
| 5,689,205 A | 11/1997 | Hughes et al. | 327/335 |
| 5,710,563 A | 1/1998 | Vu et al. | 341/161 |
| 5,760,616 A | 6/1998 | Vallancourt | 327/91 |
| 5,763,912 A | 6/1998 | Parat et al. | 297/315 |
| 5,773,997 A | 6/1998 | Stiegler | 327/53 |
| 5,790,060 A | 8/1998 | Tesch | 341/119 |
| 5,793,231 A | 8/1998 | Whittaker | 327/95 |
| 5,825,063 A | 10/1998 | Diorio et al. | 257/316 |
| 5,870,044 A | 2/1999 | Dell'ova et al. | 341/120 |
| 5,870,048 A | 2/1999 | Kuo et al. | 341/143 |
| 5,875,126 A | 2/1999 | Minch et al. | 365/185.01 |
| 5,892,709 A * | 4/1999 | Parris et al. | 365/185.01 |
| 5,898,613 A | 4/1999 | Diorio et al. | 365/185.03 |
| 5,914,894 A | 6/1999 | Diorio et al. | 365/185.03 |
| 5,933,039 A | 8/1999 | Hui et al. | 327/262 |
| 5,939,945 A | 8/1999 | Thewes et al. | 330/277 |
| 5,952,891 A | 9/1999 | Boudry | 331/57 |
| 5,952,946 A | 9/1999 | Kramer et al. | 341/136 |
| 5,955,980 A | 9/1999 | Hanna | 341/120 |
| 5,973,658 A | 10/1999 | Kim et al. | 345/92 |
| 5,982,313 A | 11/1999 | Brooks et al. | 341/143 |
| 5,982,315 A | 11/1999 | Bazarjani et al. | 341/143 |
| 5,986,927 A | 11/1999 | Minch et al. | 365/185.01 |
| 5,990,512 A | 11/1999 | Diorio et al. | 257/314 |
| 5,990,816 A | 11/1999 | Kramer et al. | 341/143 |
| 6,118,398 A | 9/2000 | Fisher et al. | 341/144 |
| 6,125,053 A | 9/2000 | Diorio et al. | 365/185.03 |
| 6,130,632 A | 10/2000 | Opris | 341/120 |
| 6,134,182 A | 10/2000 | Pilo et al. | 365/233 |
| 6,137,431 A | 10/2000 | Lee et al. | 341/161 |
| 6,144,581 A | 11/2000 | Diorio et al. | 365/185.03 |
| 6,172,631 B1 | 1/2001 | Tsai et al. | 341/143 |
| 6,191,715 B1 | 2/2001 | Fowers | 341/120 |
| 6,320,788 B1 | 11/2001 | Sansbury et al. | 365/185.1 |
| 6,373,418 B1 | 4/2002 | Abbey | 341/143 |
| 6,388,523 B1 | 5/2002 | Kappes | 330/264 |
| 6,424,279 B1 | 7/2002 | Kim et al. | 341/143 |
| 6,496,128 B1 | 12/2002 | Wiesbauer et al. | 341/143 |
| 6,559,715 B1 | 5/2003 | Frake et al. | 327/558 |
| 6,570,518 B1 | 5/2003 | Riley et al. | 341/143 |
| 6,573,853 B1 | 6/2003 | Mulder | 341/155 |
| 6,583,740 B1 | 6/2003 | Schofield et al. | 341/120 |
| 6,606,119 B1 * | 8/2003 | Shibata et al. | 348/252 |
| 6,614,687 B1 | 9/2003 | Chen et al. | 365/185.18 |
| 6,664,909 B1 | 12/2003 | Hyde et al. | 341/144 |
| 6,795,347 B1 | 9/2004 | Ausserlechner et al. | 365/185.28 |
| 6,853,583 B1 | 2/2005 | Diorio et al. | 365/185.21 |
| 6,898,097 B1 | 5/2005 | Dugger et al. | 365/45 |
| 6,909,389 B1 | 6/2005 | Hyde et al. | 341/144 |
| 2002/0089440 A1 | 7/2002 | Kranz et al. | 341/143 |
| 2003/0045263 A1 | 3/2003 | Wakayama et al. | 455/323 |
| 2004/0004861 A1 | 1/2004 | Srinivas et al. | 365/202 |
| 2004/0037127 A1 | 2/2004 | Lindhorst et al. | 365/202 |
| 2004/0124892 A1 | 7/2004 | Diorio et al. | 327/112 |
| 2004/0206999 A1 | 10/2004 | Hyde et al. | 257/312 |
| 2004/0240278 A1 | 12/2004 | Brady et al. | 365/189.09 |
| 2005/0104119 A1 | 5/2005 | Diorio et al. | 257/315 |

OTHER PUBLICATIONS

Bugeja, et al., "A Self-Trimming 14-b 100-MS/s CMOS DAC", IEEE Journal of Solid-State Circuits, vol. 35, No. 12, Dec. 2000, pp. 1841-1852.

Bugeja, et al., "A 14-b, 100-MS/s CMOS DAC Designed for Spectral Performance", IEEE Journal of Solid-State Circuits, vol. 34, No. 12, Dec. 1999, pp. 1719-1732.

Diorio, et al., "A Floating-Gate MOS Learning Array with Locally Computed Weight Updates" IEEE Transactions on Electron Devices, vol. 44, No. 12, Dec. 1997, pp. 1-10.

Diorio, et al., "A High-Resolution Non-Volatile Analog Memory Cell", IEEE Intl. Symp. On Circuits and Systems, vol. 3, 1995, pp. 2233-2236.

Gray, et al., "Analysis and Design of Analog Integrated Circuits", Second Edition, University of California, Berkeley, 1984, pp. 66-71.

Hasler, et al., "Single Transistor Learning Synapses", Cambridge, MA, The MIT Press, 1995, pp. 817-824.

Hasler, et al., "Single Transistor Learning Synapse with Long Term Storage", IEEE, 1995, pp. 1660-1663.

Pelgrom et al., "Matching Properties of MOS Transistors", IEEE Journal of Solid State Circuits, vol. 24, No. 5, Oct. 1989, pp. 1433-1440.

Tille, et al., "A 1.8-V MOSFET-Only $\Sigma \Delta$ Modulator Using Substrate Biased Depletion-Mode MOS Capacitors in Series Compensation", IEEE, Journal of Solid-State Circuits, vol. 36, No. 7, Jul. 2001, pp. 1041-1046.

Tsividis, et al., "Continuous-Time MOSFET-C Filters in VLSI", IEEE Transactions on Circuits and Systems, vol. CAS-33, No. 2, Feb. 1986, pp. 125-140.

Van der Plas, et al., "A 14-bit Intrinsic Accuracy $Q^2$ Random Walk CMOS DAC", IEEE Journal of Solid-State Circuits, vol. 34, No. 12, Dec. 1999, pp. 1708-1718.

Vittoz, "Dynamic Analog Techniques", Design of MOS VLSI Circuits for Telecommunications, Chapter 5, 1985, pp. 145-170.

Vittoz, "Dynamic Analog Techniques", Design of Analog-Digital VLSI Circuits for Telecommunications and Signal Processing, Chapter 4, 1994, pp. 97-124.

Tsividis et al., "Continuous-Time Filters", Design of Analog-Digital VLSI Circuits for Telecommunications and Signal Processing, Chapter 6, 1994, pp. 177-211.

Gray et al., "Analog-Digital Conversion Techniques for Telecommunications Applications", Design of Analog-Digital VLSI Circuits for Telecommunications and Signal Processing, Chapter 9, 1994, pp. 289-315.

Temes "Delta-Sigma Data Converters", Design of Analog-Digital VLSI Circuits for Telecommunications and Signal Processing, Chapter 10, 1994, pp. 317-339.

Yoshizawa, et al., "MOSFET-Only Switched-Capacitor Circuits in Digital CMOS Technology", IEEE Journal of Solid-State Circuits, vol. 34, No. 6, Jun. 1999, pp. 734-747.

Carley, L. Richard, "Trimming Analog Circuits Using Floating-Gate Analog MOS Memory", IEEE Journal of Solid-State Circuits, vol. 24, No. 6, pp. 1569-1575, Dec. 1989.

Partial International Search for International Application No. PCT/US03/31792, date mailed Apr. 2, 2004.

Hyde, et al.; "A Floating-Gate Trimmed, 14-Bit, 250 Ms/s Digital-to-Analog Converter in Standard 0.25 um CMOS", Impinj, 2002 Symposium on VLSI Circuits, Honolulu HI; pp. 328-331.

* cited by examiner

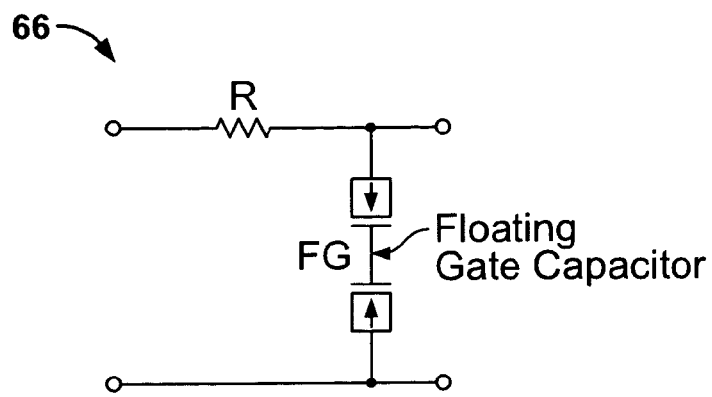
FIG. 6A
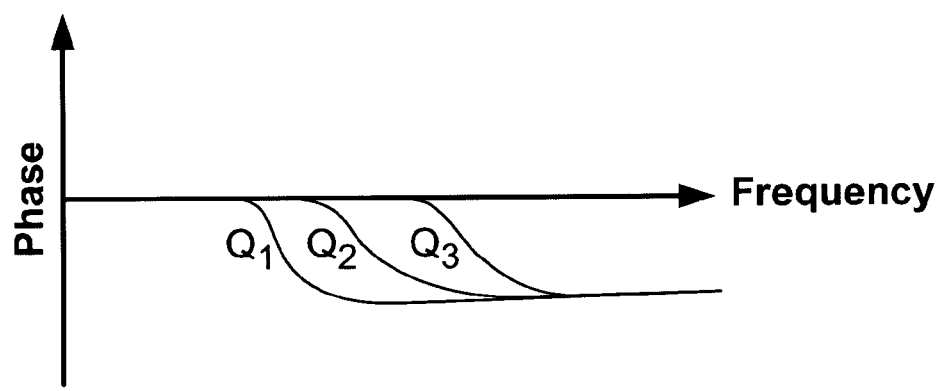
FIG. 6B
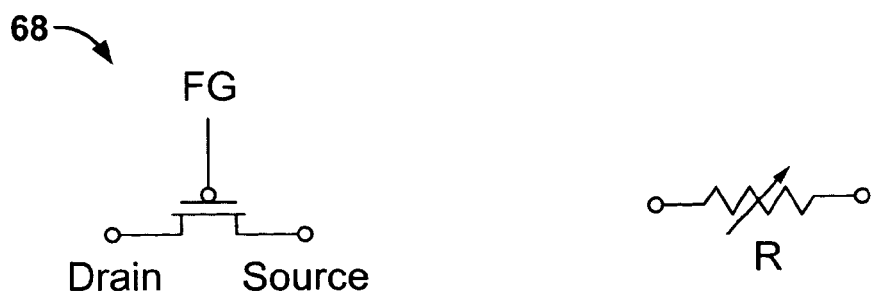
FIG. 7A
FIG. 7B

USE OF ANALOG-VALUED FLOATING-GATE TRANSISTORS FOR PARALLEL AND SERIAL SIGNAL PROCESSING

CROSS-REFERENCE TO RELATED APPLICATION

This application is a divisional of co-pending U.S. patent application Ser. No. 10/268,116, filed on Oct. 8, 2002, entitled "Use of Analog-Valued Floating-Gate Transistors for Parallel and Serial Signal Processing" in the name of the same inventors and commonly owned herewith.

FIELD OF THE INVENTION

The present invention is directed to the use of analog-valued floating-gate transistors as trim devices in parallel and serial signal processing circuits.

BACKGROUND OF THE INVENTION

In order to efficiently process high-bandwidth or high-dynamic range signals, designers often employ serial or parallel processing methods. Parallel processing is a technique in which a signal, or some portion of a signal, is introduced into two or more signal paths and processed simultaneously by the plural signal paths. Parallel processing allows the use of many subcircuits, each with potentially relaxed specifications, to perform the signal processing work of a single circuit with possibly more stringent specifications. Parallel signal processing provides many benefits, but it also raises some unique challenges. The parallel paths must have tightly controlled characteristics to provide the coordination necessary for efficient operation. A recombination operation usually follows parallel processing, and the accuracy and purity of the final result depends on having known and controlled characteristics in each of the parallel signal paths. Serial signal processing is a method utilizing a cascade of processing stages. A signal propagates from the output of one stage to the input of the next, and is usually modified in some way at each stage. Serial processing provides many of the benefits of parallel processing through the relaxation of requirements at each stage to meet a given overall performance goal. The challenges of maintaining well-controlled characteristics that apply to parallel signal processing are also relevant in serial signal processing. In order to efficiently process signals, the stages must have known and consistent behavior.

Parallel signal processing is a technique well-suited to implementation in an integrated circuit. Advantages of higher levels of integration include the ability to construct many circuits in a small physical space. Digital circuits have benefited greatly from technology advancements that enable higher levels of integration. Unfortunately, the performance of analog integrated circuits has generally not kept pace with the improvements seen by digital circuits. One way to improve analog circuit performance, while taking advantage of higher levels of circuit integration, is to utilize parallel processing techniques. By employing multiple circuits, properly coordinated, with outputs suitably combined, significant performance improvement is possible. FIG. 1A is a system block diagram of a parallel signal processing system 10 in accordance with the prior art. A signal 12 to be processed in a parallel system first passes from the input 14 through a splitting operation 16. The splitting operation may separate the signal into its constituent components such as amplitude, frequency, offset voltage, or phase. Or, in the simplest case, the entire signal may be distributed unmodified to the n outputs 18(1), 18(2), 18(3), . . . , 18(n) of the splitter. The signal, or a selected component of that signal, is then coupled into the n processing branches 20(1), 20(2), 20(3), . . . , 20(n) that make up the paths of the parallel processor 10. The processing branches may act independently of each other, or there may be some interaction among processing stages in different paths as illustrated by cross links 22(1), 22(2), 22(3), . . . , 22(n). One example of this interaction is an averaging function. The outputs of the signal paths are generally recombined as in recombiner block 24, in some cases as an analog process and in some cases as a digital process, according to the design and function of the processor. The accuracy of the final result 26 and the efficiency of the overall processing operation are heavily dependent on each signal path having an accurate implementation of the proper transfer function as required by the design of the processor 10.

Serial signal processing is an established and well-known technique for modifying the parameters of a signal by passing it through a series of processing stages. FIG. 1B is a system block diagram of a serial signal processing system 28 in accordance with the prior art. The signal parameter of interest could be signal power, as is the case with a signal propagating through many stages of amplification in a transmitter chain prior to coupling to an antenna Alternatively the signal parameter of interest could be the frequency of a signal as it is modified by the stages of a superheterodyne receiver. Many other parameters may be processed. Regardless of the specific parameter, serial processing is an important and generally necessary technique for processing signals that experience a wide parameter variation while processed by a system. By dividing the signal processing operation into a set of steps, it is possible to design a system that is robust and efficient in both design and implementation.

FIG. 1B illustrates some of the key attributes of serial signal processing. A signal 30, introduced into an input 32 of the system, is modified by the first processing stage 34. That stage 34 has an output 36 for coupling the modified signal into the input 38 of the next stage 40, where the signal undergoes further modification, possibly of a different nature. The signal propagates through as many stages as required (e.g., stages 42, 44 and 46), and experiences as many modifications as required, to extract the desired result from the cascade of stages (34, 40, 42, 44, 46) comprising the serial signal processing system 28. Signal propagation generally proceeds from the input 32 toward the output 48, through the processing stages (34, 40, 42, 44, 46). Versions of the input signal 30, modified by the processing stages, may be used by other stages further along the serial path, bypassing some stages in the process. All of the paths which are designed to propagate signals in the direction from the input 32 toward the output 48 of the serial signal processor 28 are considered "feedforward" paths (e.g., paths 50, 52). By contrast, "feedback" paths (e.g., paths 54, 56) convey signals from a stage or stages toward stages that are closer to the signal input 32 in the main propagation path. With proper design, serial processing systems can efficiently process signals of a widely varying nature, as are common in communication applications.

While providing many benefits, serial signal processing has some disadvantages. Errors in the processing of a signal in a serial system are cumulative. If a signal is corrupted in a stage of the system, the corrupted version of the signal propagates through subsequent stages of the system. This signal corruption may lead to increased power draw, reduced gain, further corruption due to mixing effects, or undesired system performance. Serial processing systems that employ feedback paths must have controlled and predictable characteristics of the feedback signals in order to ensure system stability. It is imperative, then, for each stage in a serial signal processing system to have well-controlled characteristics.

Many applications call for a combination of parallel and serial processing methods. Each of the signal paths in a parallel processor may include a cascade of stages in series, or a serial processing system may incorporate one or more stages utilizing parallel processing techniques. The design of a system with any combination of serial and parallel processing must consider all of the attributes of each method. The requirement for well-controlled signal response is especially relevant in systems employing a combination of parallel and serial methods.

In conventional integrated circuit design, engineers construct circuits from transistors, resistors, capacitors, and other standard circuit elements. These circuit elements have variances in their respective circuit parameters. For example, transistors have variances in their threshold voltage, width, and length. These variances are due in part to process and temperature gradients. Minimizing the error in parallel and serial circuits requires reducing the effects of these variances. Many techniques for reducing these effects are known in the art, including using large transistors, using lasers to trim resistors, using capacitors to dynamically match devices in response to on-chip error signals, and the like. In general, these approaches have significant disadvantages. For example, large transistors require large currents to operate at high speeds, consume relatively large amounts of die area and power, and do not compensate for temperature- or aging-induced errors. Likewise, using lasers to trim resistors necessitates large resistors, a time-consuming laboratory laser trim process, and again does not compensate temperature- or aging-induced errors. Using capacitors to dynamically trim circuit elements requires wideband error-feedback loops and relatively frequent updates due to the fact that most on-chip capacitors leak due to the thermal generation of carriers in pn junctions.

Consequently, there is a compelling need for a simple and compact means to trim circuit elements on chip, at a slow and deliberate rate, without rapid leakage or the need for frequent calibration updates.

BRIEF DESCRIPTION OF THE INVENTION

Analog-valued floating-gate transistors are used as trimmable circuit components for modifying and/or controlling the gain, phase, offset, frequency response, current consumption, and/or transfer function of signal pathways in parallel and/or serial processing circuits in radio frequency, analog, or mixed-signal integrated circuits.

BRIEF DESCRIPTION OF THE DRAWINGS

The accompanying drawings, which are incorporated into and constitute a part of this specification, illustrate one or more embodiments of the present invention and, together with the detailed description, serve to explain the principles and implementations of the invention.

In the drawings:

FIG. 6A is an electrical schematic diagram of an R-C filter circuit element with a trimmable phase response in accordance with one embodiment of the present invention.

FIG. 6B is a plot of phase vs. frequency for the circuit element of FIG. 6A.

FIG. 7A is an electrical schematic diagram of a trimmable MOS resistor circuit element used in a triode configuration to have a variable effective electrical resistance dependent upon charge, Q, stored on its floating gate, FG, in accordance with one embodiment of the present invention.

FIG. 7B is an equivalent schematic diagram of the circuit element of FIG. 7A.

DETAILED DESCRIPTION

Figure 1A:
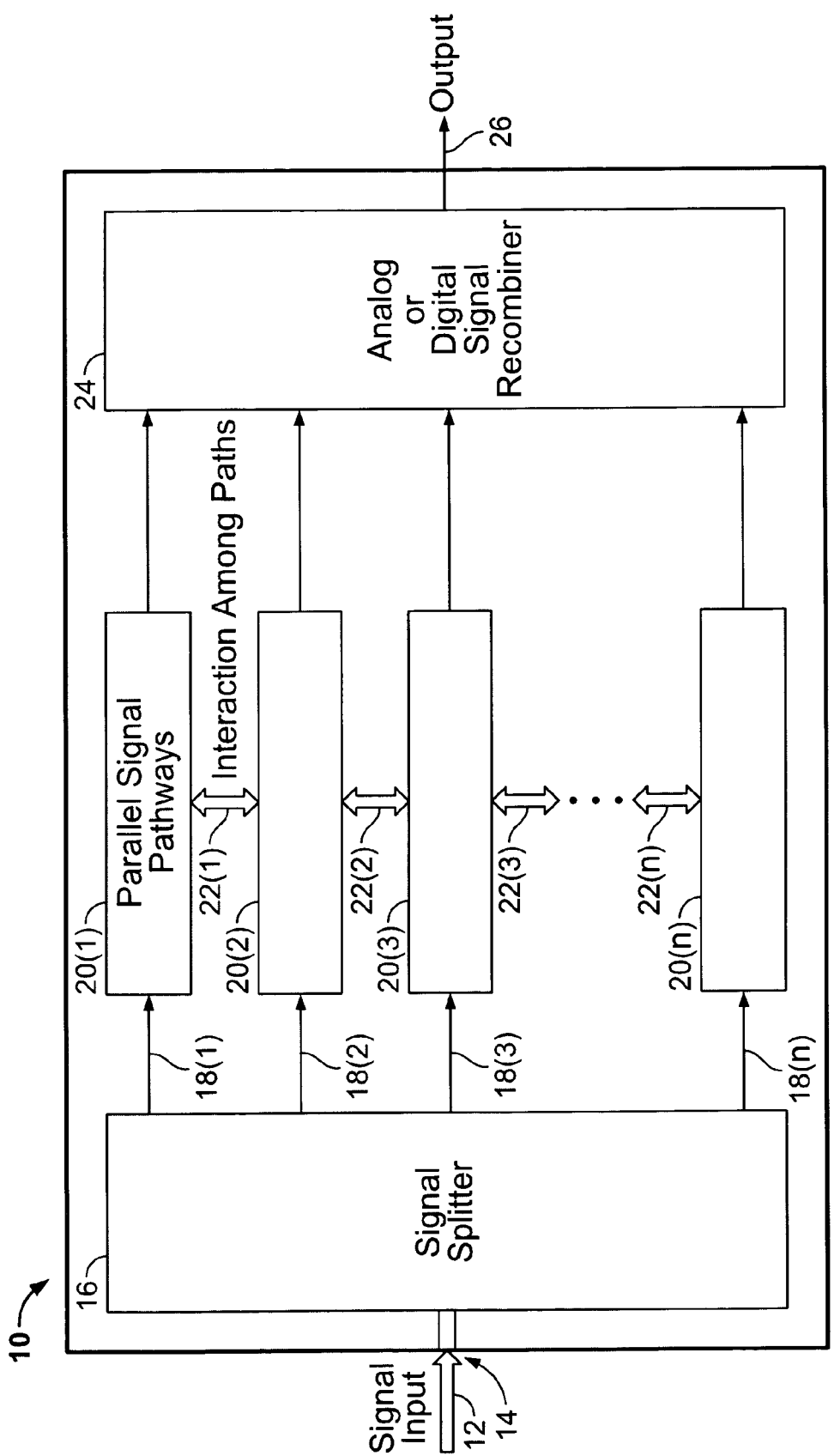
FIG. 1A is a system block diagram of a parallel signal processing system in accordance with the prior art.
Figure 1B:
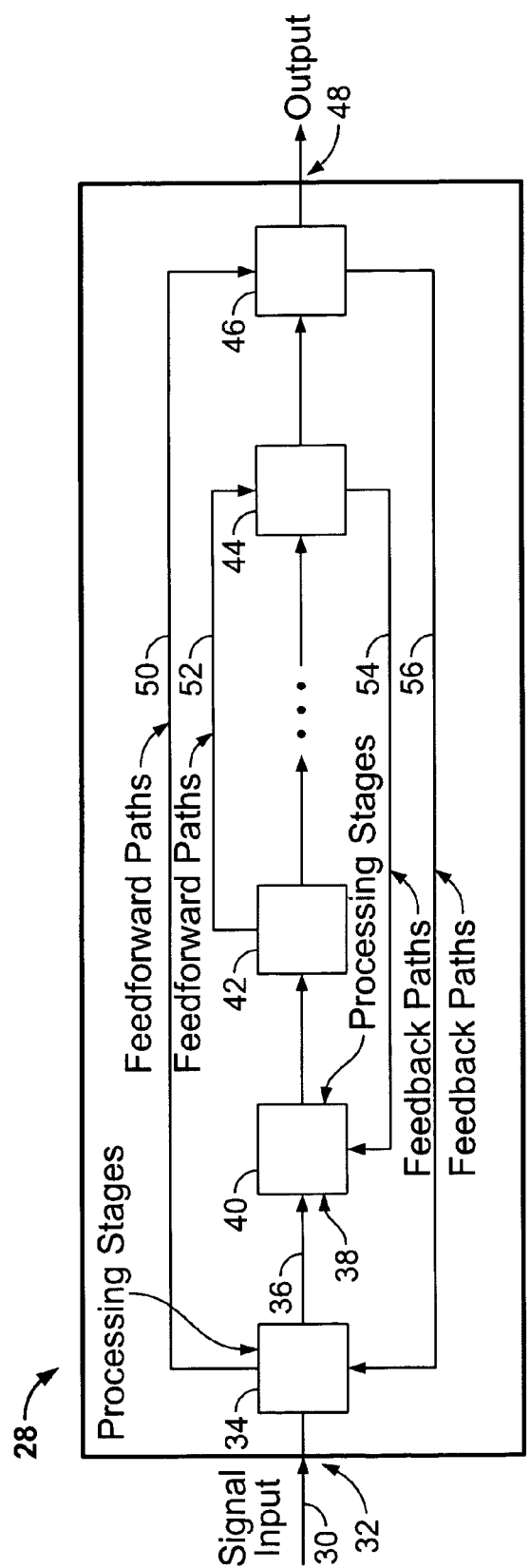
FIG. 1B is a system block diagram of a serial signal processing system in accordance with the prior art.

Embodiments of the present invention are described herein in the context of the use of analog-valued floating-gate transistors as trim devices in parallel and serial signal processing circuits. Those of ordinary skill in the art will realize that the following detailed description of the present invention is illustrative only and is not intended to be in any way limiting. Other embodiments of the present invention will readily suggest themselves to such skilled persons having the benefit of this disclosure. Reference will now be made in detail to implementations of the present invention as illustrated in the accompanying drawings. The same reference indicators will be used throughout the drawings and the following detailed description to refer to the same or like parts.

In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application- and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

The present invention pertains to the use of analog-valued floating-gate MOSFETs as trim devices to control or modify the electrical characteristics of the signal paths in parallel and/or serial signal processing circuits in order to accurately establish and maintain a desired signal response. It is applicable in RF (radio frequency), analog, and/or mixed-signal circuits such as amplifiers, mixers, analog-to-digital converters, digital-to-analog converters, analog filters, oscillators and the like. Such circuits are commonly applicable to telecommunications, signal processing, wireless communications, data storage and retrieval, instrumentation and the like. It provides an entirely new means for control of signal transfer characteristics: by adjusting the transistors themselves. It is not limited to any particular application, but instead is a general approach for performing circuit characteristic matching in parallel and/or serial RF, mixed signal or analog CMOS (complementary metal oxide semiconductor) integrated circuits.

Diorio et al. in U.S. Pat. No. 5,990,512 describe a p-channel floating-gate MOSFET (pFET) whose input-output characteristics can be continuously adjusted during normal transistor operation by adding electrons to or removing electrons from the floating gate. These kinds of pFETs are used in the present invention to reduce or eliminate error, inaccuracy, or distortion in parallel and/or serial RF, mixed-signal, and/or CMOS integrated circuits.

Two key attributes of analog-valued floating-gate MOSFETs (described, for example, in U.S. Pat. Nos. 5,990,512 and 6,125,053) are: (1) their operating characteristics can be adjusted after circuit fabrication, and (2) such adjustments are stored in a nonvolatile manner that can last for months or years without subsequent intervention. With these devices feedback techniques can be used to tune or trim individual transistors within an integrated circuit after circuit fabrication and one can be assured that the trim will not be lost by rapid leakage or other mechanisms. In this manner parallel or serial signal processing circuits can now be built in accordance with the techniques taught herein that can be adjusted for optimal performance using either off-chip or on-chip calibration loops, either once (typically at beginning of circuit life), occasionally (as required), or continuously during circuit operation. The ability to make these adjustments improves performance in parallel or serial circuits by maintaining consistent and controlled circuit behavior according to design parameters and by reducing errors due to device mismatch regardless of whether the mismatch manifests itself as gain errors, offset errors, phase-response errors, current consumption errors, frequency-response errors, or transfer-function errors. Trimming individual transistors on a one-time, occasional or a continuous basis greatly expands the applicability of parallel or serial analog signal-processing techniques, because trimming can remove mismatch-induced errors that could otherwise impair performance.

Using analog-valued MOSFETs as trim devices allows precise control over (1) gain, (2) offset, (3) phase response, (4) current consumption, (5) frequency response, and (6) transfer function in signal-processing circuits.

Figure 2A:
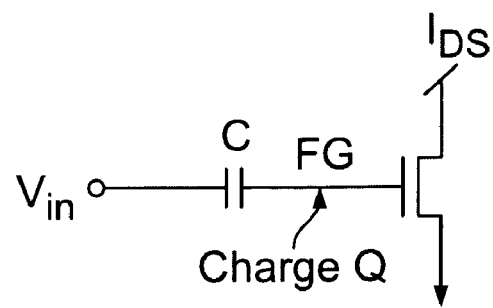
FIG. 2A is an electrical schematic diagram of an n-channel analog-valued MOSFET (metal oxide semiconductor field effect transistor) having a voltage input node, Vin, a capacitor, c, coupled between node Vin and a floating gate, FG, and an n-channel MOSFET having floating gate FG as its floating gate.

FIG. 2A is an electrical schematic diagram of an n-channel analog-valued MOSFET (metal oxide semiconductor field effect transistor) having a voltage input node, Vin, a capacitor, c, coupled between node Vin and a floating gate, FG, and an n-channel MOSFET having floating gate FG as its floating gate.

Figure 2B:
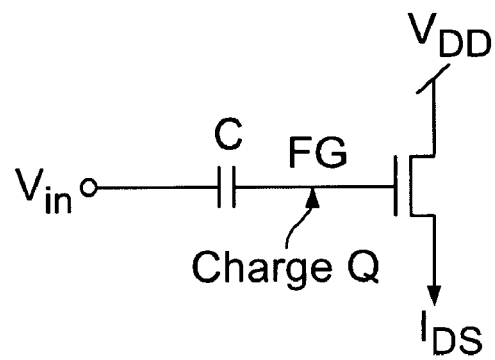
FIG. 2B is an electrical schematic diagram of a p-channel analog-valued MOSFET having a voltage input node, Vin, a capacitor, c, coupled between node Vin and a floating gate, FG, and a p-channel MOSFET having floating gate FG as its floating gate.

FIG. 2B is an electrical schematic diagram of a p-channel analog-valued MOSFET having a voltage input node, Vin, a capacitor, c, coupled between node Vin and a floating gate, FG, and a p-channel MOSFET having floating gate FG as its floating gate.

Figure 2C:
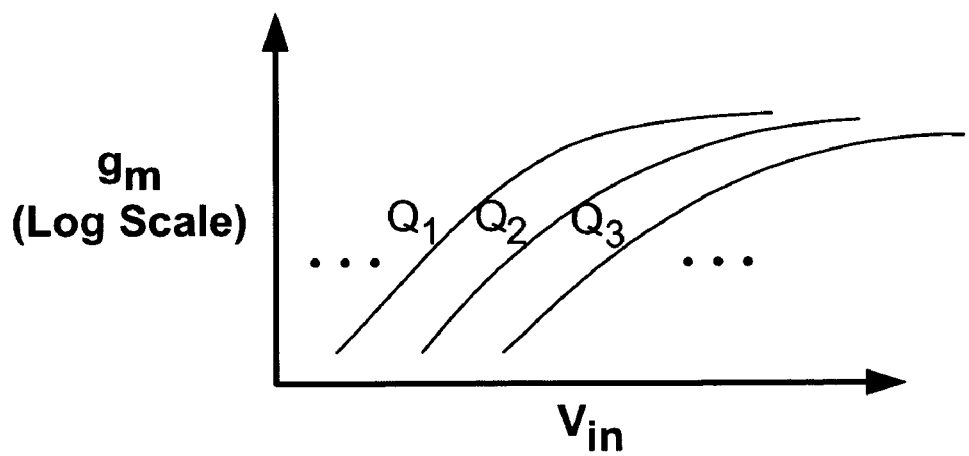
FIG. 2C is a plot of $\log(g_m)$ vs. Vin illustrating how the gain in performance characteristic $g_m$ (voltage-to-current gain or transconductance) of the devices of FIGS. 2A and 2B changes as a function of the charge, Q, stored on the floating gate, FG.

FIG. 2C is a plot of $\log(g_m)$ vs. Vin illustrating how the gain in performance characteristic $g_m$ (voltage-to-current gain or transconductance) of the devices of FIGS. 2A and 2B changes as a function of the charge, Q, stored on the floating gate, FG.

Figure 2D:
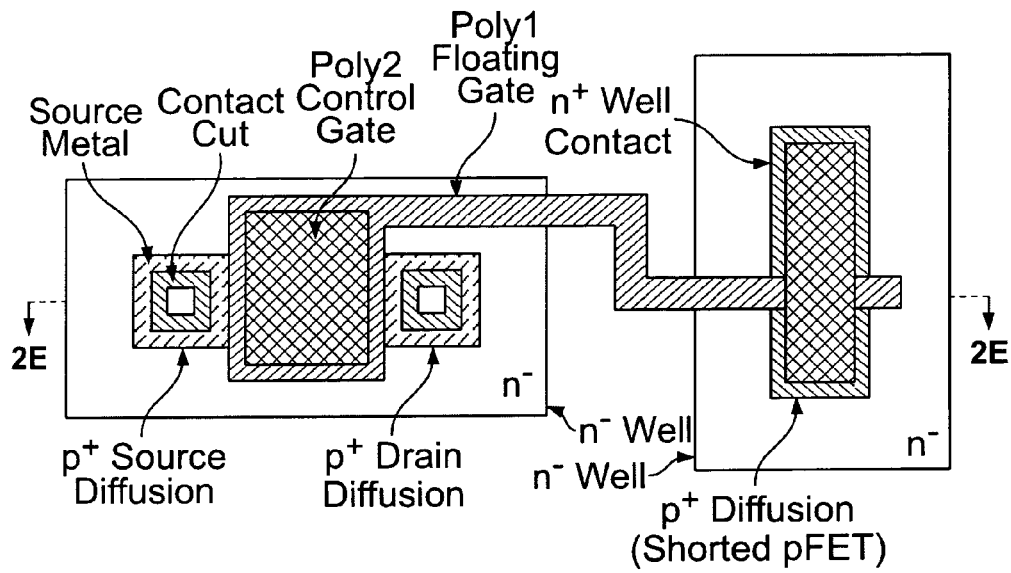
FIG. 2D is an illustration of a pFET floating-gate transistor layout.

FIG. 2D is an illustration of a pFET floating-gate transistor layout.

Figure 2E:
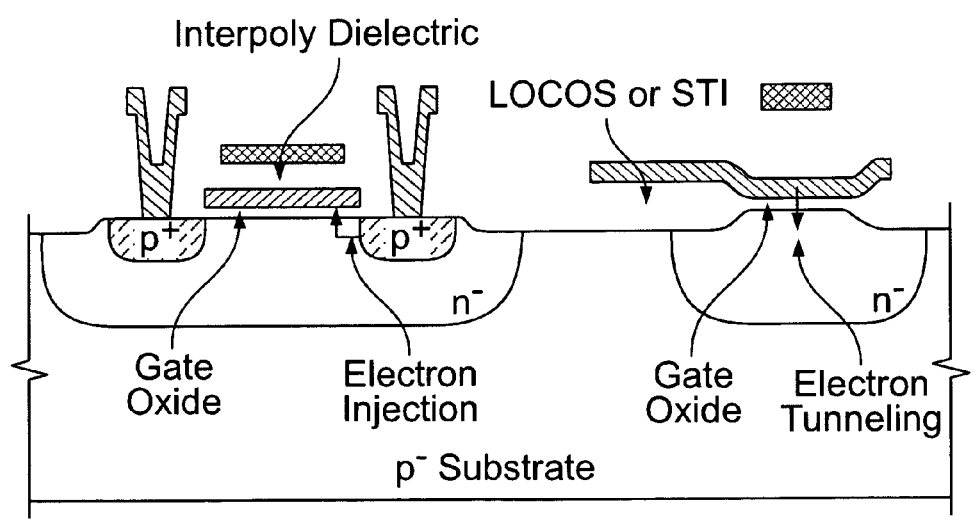
FIG. 2E is a side elevational diagram of the pFET floating-gate transistor of FIG. 2D.

FIG. 2E is a side elevational diagram of the pFET floating-gate transistor of FIG. 2D.

Figure 2F:
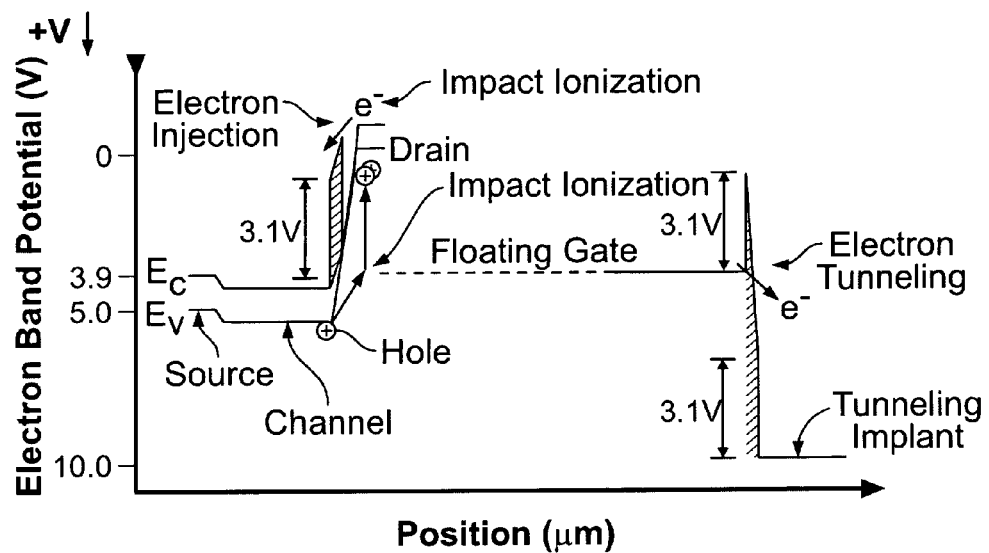
FIG. 2F is an electron band diagram of the pFET floating-gate transistor of FIGS. 2D and 2E.

FIG. 2F is an electron band diagram of the pFET floating-gate transistor of FIGS. 2D and 2E.

A floating-gate transistor, as it pertains to the present invention, is a conventional transistor with the following additional attributes: (1) nonvolatile analog weight storage, (2) locally computed bidirectional weight updates, and (3) simultaneous memory reading and writing. Floating-gate transistors use floating-gate charge to represent the nonvolatile analog weight, electron tunneling and hot-electron injection to modify the floating-gate charge bidirectionally, and allow simultaneous memory reading and writing by nature of the mechanisms used to write the memory. Various versions of a pFET floating-gate transistor may be used, for example, single poly versions of the pFET floating-gate transistor may be used.

The floating-gate transistor of FIGS. 2D, 2E and 2F comprises two MOSFETs: The first (on the left) is a readout transistor; the second (on the right), with shorted drain and source, forms a tunneling junction. From the control-gate's perspective, removing electrons from or adding electrons to the floating gate shifts the readoutpFET's threshold voltage bidirectionally. The floating-gate transistor uses Fowler-Nordheim (FN) tunneling to remove electrons from its floating gate, and impact-ionized hot-electron injection (IHEI) to add electrons to the floating gate. In accordance with this embodiment, each MOSFET is disposed in its own n-well of a p-substrate. A double poly process is used which provides a capacitively coupled control gate. P+ doped regions are used for the source and drain of the readout transistor. Portions D, E and F of FIG. 2 are aligned vertically to show, respectively, a top view, a side cross-sectional view, and an electron band diagram.

Key features of this floating-gate transistor are (A) the readout transistor remains a fully functional p-channel MOSFET; (B) high voltages applied to the tunneling junction tunnel electrons off the floating gate; (C) large drain-to-source voltages cause IHEI at the drain, injecting electrons onto the floating gate.

In accordance with the FIG. 2D, 2E, 2F embodiment, signal inputs are applied to the second-level polysilicon (poly2) control gate, which, in turn, couples capacitively to the first-level polysilicon (poly1) floating gate. From the control gate's perspective the transistor remains a conventional p-channel MOSFET, albeit with reduced coupling to the channel because of the intervening poly1 including capacitor. A number of alternative designs for floating-gate transistors (including single-poly designs) are set forth in co-pending U.S. patent application Ser. No. 10/192,773 filed Jul. 9, 2002, now U.S. Pat. No. 6,965,142. note that nFETs may be used where simultaneous read out and writing is not a requirement.

Figure 3A:
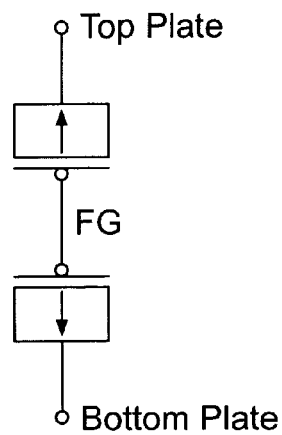
FIG. 3A is an electrical schematic diagram of a MOSCAP variable capacitor implemented with a pair of floating gate pFETs (p-channel MOSFETs) having a top plate node, a bottom plate node and a floating gate, FG, where charge, Q, stored of the floating gate controls the capacitance of the device as measured between the top plate node and the bottom plate node.

FIG. 3A is an electrical schematic diagram of a MOSCAP variable capacitor implemented with a pair of floating gate pFETs (p-channel MOSFETs) having a top plate node, a bottom plate node and a common floating gate, FG, where charge, Q, stored on the floating gate controls the capacitance of the device as measured between the top plate node and the bottom plate node.

Figure 3B:
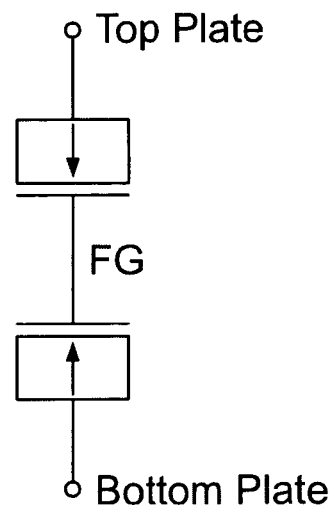
FIG. 3B is an electrical schematic diagram of a MOSCAP variable capacitor implemented with a pair of floating gate nFETs (n-channel MOSFETs) having a top plate node, a bottom plate node and a floating gate, FG, where charge, Q, stored of the floating gate controls the capacitance of the device as measured between the top plate node and the bottom plate node.

FIG. 3B is an electrical schematic diagram of a MOSCAP variable capacitor implemented with a pair of floating gate nFETs (n-channel MOSFETs) having a top plate node, a bottom plate node and a floating gate, FG, where charge, Q, stored of the floating gate controls the capacitance of the device as measured between the top plate node and the bottom plate node. Note that the tunneling junction has been omitted from FIGS. 3A and 3B for clarity.

Figure 3C:
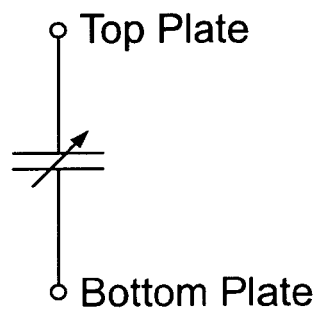
FIG. 3C is an electrical schematic diagram of an equivalent circuit to FIGS. 3A and 3B.

FIG. 3C is an electrical schematic diagram of an equivalent circuit to FIGS. 3A and 3B.

Figure 3D:
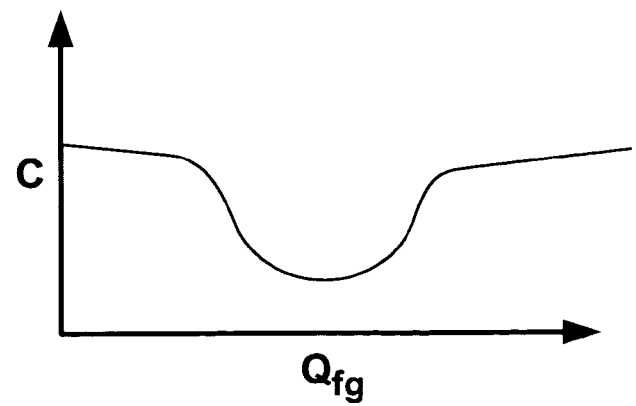
FIG. 3D is a plot of capacitance vs. charge, Q, stored on the floating gate, FG, of the devices of FIGS. 3A and 3B.

FIG. 3D is a plot of capacitance vs. charge, Q, stored on the floating gate, FG, of the devices of FIGS. 3A and 3B.

FIGS. 3A–3D relate to the use of an analog-valued floating-gate MOSFET to adjust a capacitor value, which can be used to adjust gain because a smaller capacitor has a larger device voltage for a given current input (by dV/dt=I/C) than a larger capacitor.

Figure 4A:
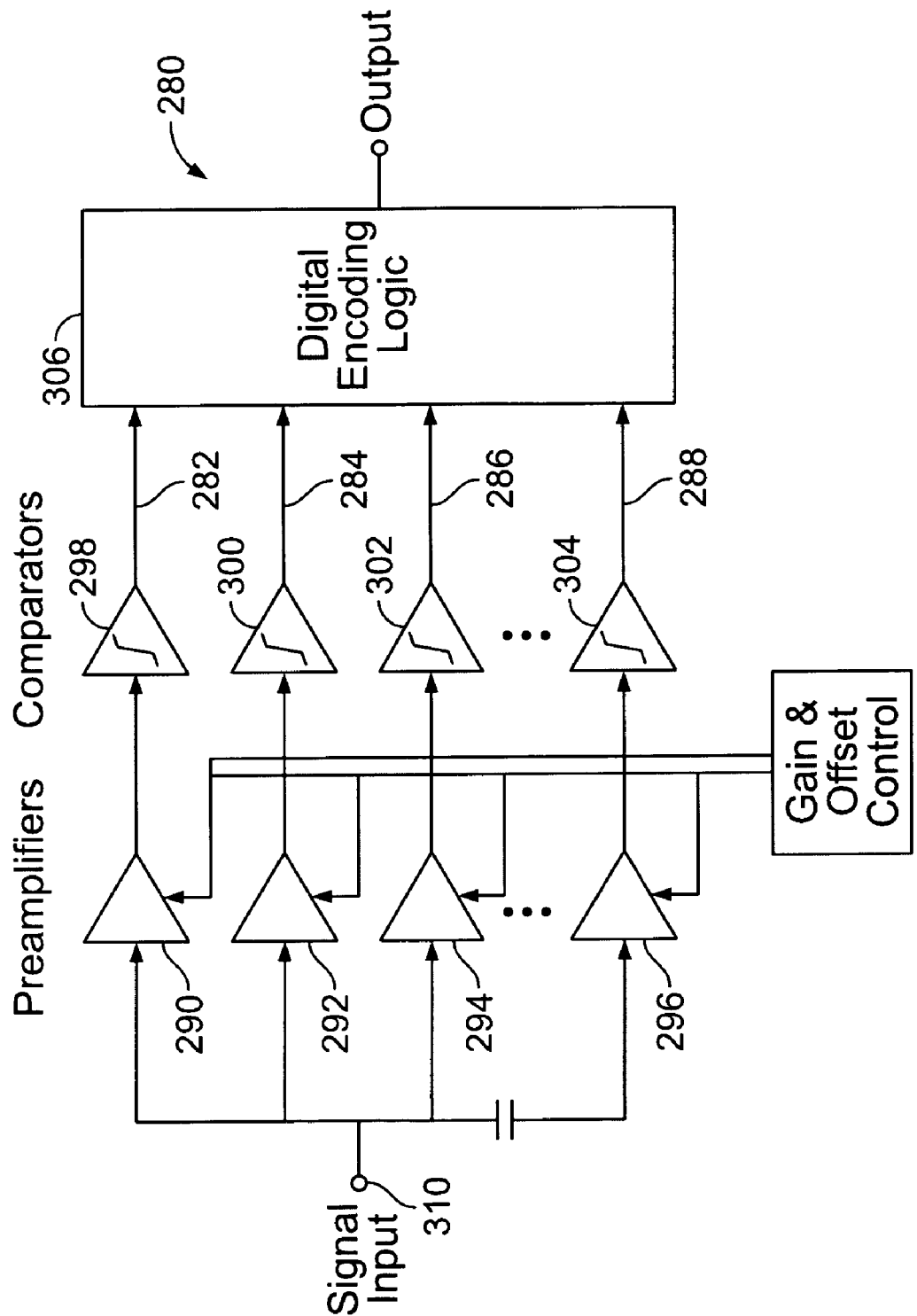
FIG. 4A is a system block diagram of an analog to digital converter (ADC) in accordance with one embodiment of the present invention.

FIG. 4A is a system block diagram of an analog to digital converter (ADC) in accordance with one embodiment of the present invention.

Figure 4B:
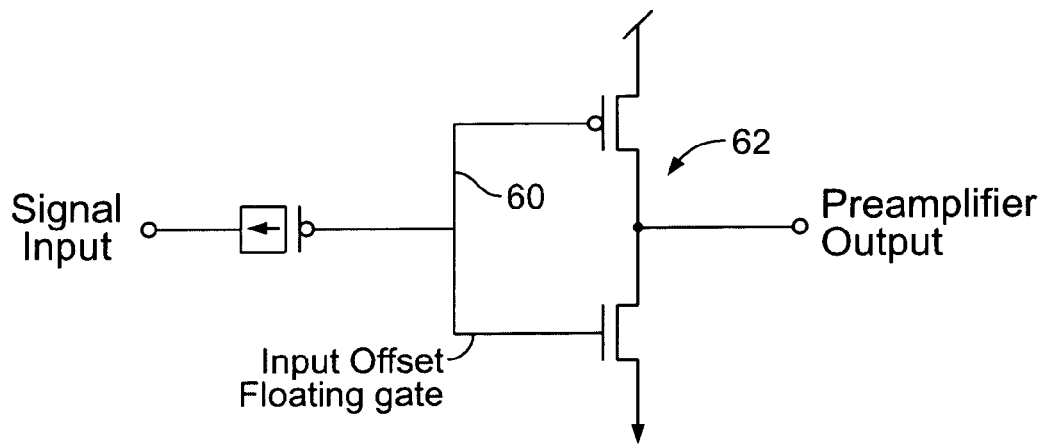
FIG. 4B is an electrical schematic diagram of an amplifier circuit element using a MOSCAP capacitor as an input coupling element and the charge stored on a floating gate to vary the threshold voltage offset of the amplifier in accordance with one embodiment of the present invention.

Another example application of the present invention is a flash analog-to-digital converter (ADC) 280, as illustrated in the system block diagram of FIG. 4A. The ADC 280 is a serial/parallel system including many parallel paths 282, 284, 286, 288, each of which is a cascade of a preamplifier 290, 292, 294, 296 and a comparator 298, 300, 302, 304. The comparator outputs are processed by a digital logic network 306, which has as its output 308 a binary coded numerical representation of the input voltage at node 310. Each parallel path represents one of the possible binary states, and the analog input voltage that corresponds to a particular binary value depends on the offset of the parallel path representing that state. The accuracy of the ADC is a direct function of the accuracy of the offset voltage of the preamplifier/comparator cascade. The ability to adjust offset voltages to compensate for manufacturing imperfections, temperature and aging effects provides significant benefits in terms of performance, efficiency, and cost. Compensation for imperfection is not the only benefit provided by adjustable offsets, however. Most system designs incorporate linear ADCs, and a measure of the quality of the converter is how closely its analog-to-digital transfer characteristic adheres to a straight line. Other systems require a non-linear transfer characteristic. By setting the offset voltages in an exponential arrangement centered at the DC value of the input voltage, it is possible to flatten the signal-to-quantization-noise ratio curve over a wide range of input signals, a common technique known as companding. An ADC design which allows an arbitrary transfer function has great flexibility and is suitable for a wide range of applications. FIG. 4B is an electrical schematic diagram of a circuit 62 of one of the preamplifiers 290, 292, 294, 296 showing the use of analog-valued floating-gate MOSFETs for establishing the offset voltage of a very simple preamplifier. By controlling the charge on the input offset floating gate node 60, the offset voltage of each preamplifier is independently controllable. This control provides a means of compensating for imperfections in both the preamplifier and the comparator and also for programming any desired ADC transfer characteristic.

FIG. 4B is an electrical schematic diagram of an amplifier circuit element using a MOSCAP capacitor as an input coupling element and charge stored on floating gate 60 to vary the offset voltage of the amplifier in accordance with one embodiment of the present invention.

Figure 4C:
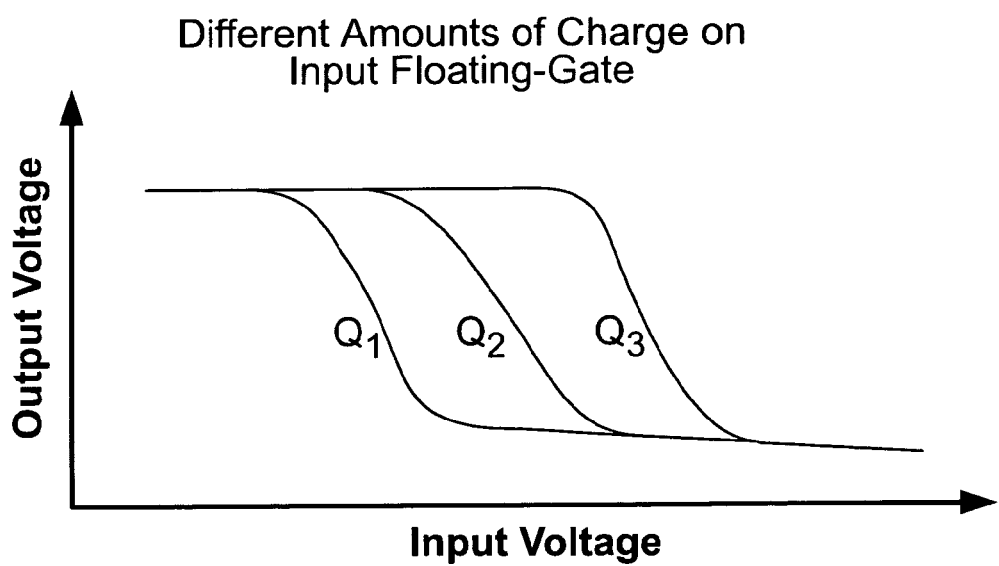
FIG. 4C is a plot of the transfer function of the amplifier circuit element of FIG. 4B illustrating how it changes as a function of charge, Q, stored on floating gate 60.

FIG. 4C is a plot of the transfer function of the amplifier circuit element of FIG. 4B illustrating how it changes as a function of charge, Q, stored on floating gate 60.

FIG. 4B illustrates a technique for using analog-valued floating-gate MOSFETs to adjust the input offset of an inverter (a simple voltage amplifier). This is accomplished by varying the charge, Q, stored on floating-gate 60.

Figure 5A:
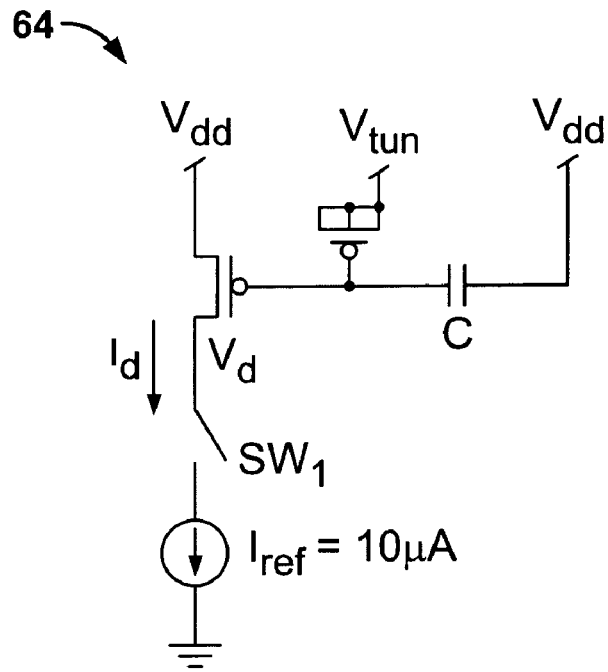
FIG. 5A is an electrical schematic diagram of a circuit for setting a precision output current in accordance with one embodiment of the present invention.

FIG. 5A is an electrical schematic diagram of a circuit 64 for setting a precision output current in accordance with one embodiment of the present invention. The circuit of FIG. 5A enables matched current sources with a near-zero offset between them (or other precision values, if desired).

Figure 5B:
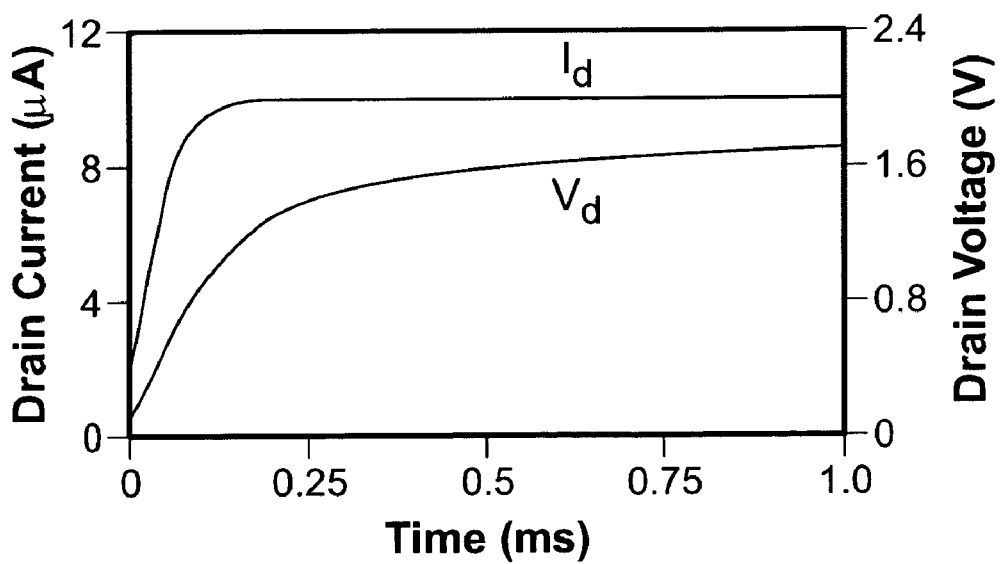
FIG. 5B is a plot of drain current and drain voltage vs. time for the circuit of FIG. 5A.

FIG. 5B is a plot of drain current (Id) and drain voltage (Vd) vs. time for the circuit of FIG. 5A.

FIG. 6A is an electrical schematic diagram of an R-C filter circuit element 66 with a trimmable phase response in accordance with one embodiment of the present invention.

FIG. 6B is a plot of phase vs. frequency for the circuit element 66 of FIG. 6A with different charges Q1, Q2 and Q3 stores on floating-gate FG of circuit 66. The circuit 66 enables a range of values for the corner frequency and thus a range of values at a given frequency.

FIG. 7A is an electrical schematic diagram of a trimmable MOS resistor circuit element 68 used in a triode configuration to have a variable effective electrical resistance dependent upon charge, Q, stored on its floating gate, FG, in accordance with one embodiment of the present invention. The trimmable MOS resistor may be formed from a MOSFET such as a pFET or an NFET operating in its unsaturated (linear) range. This may be achieved where Vd–Vs is a small value where Vd represents the voltage on the drain of the transistor and Vs represents the voltage on the source of the transistor.

FIG. 7B is an equivalent schematic diagram of the resistive circuit element 68 of FIG. 7A.

Figure 7C:
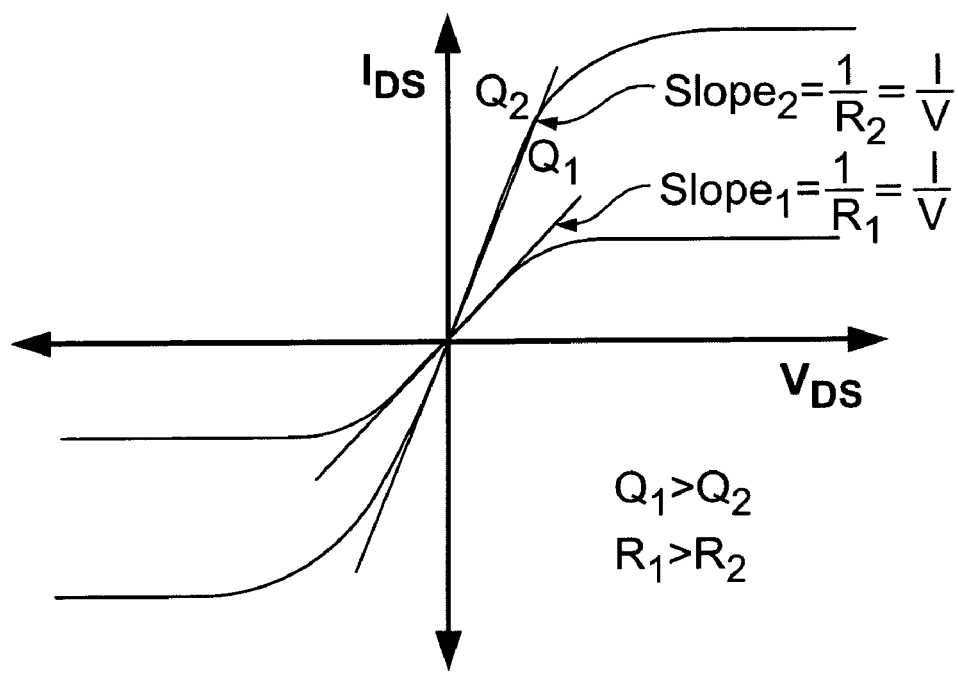
FIG. 7C is a plot of drain-source current (Ids) vs. drain-source voltage (Vds) for the device of FIG. 7A illustrating the change in resistance (1/R=Ids/Vds) as a function of charge, Q, stored on the floating gate of the device.

FIG. 7C is a plot of drain-source current (Ids) vs. drain-source voltage (Vds) for the device of FIG. 7A illustrating the change in resistance (1/R=Ids/Vds) as a function of charge, Q, stored on the floating gate, FG, of the resistor 68. The circuit 68 can be used, for example, to control the phase response of RC compensation networks.

Figure 7D:
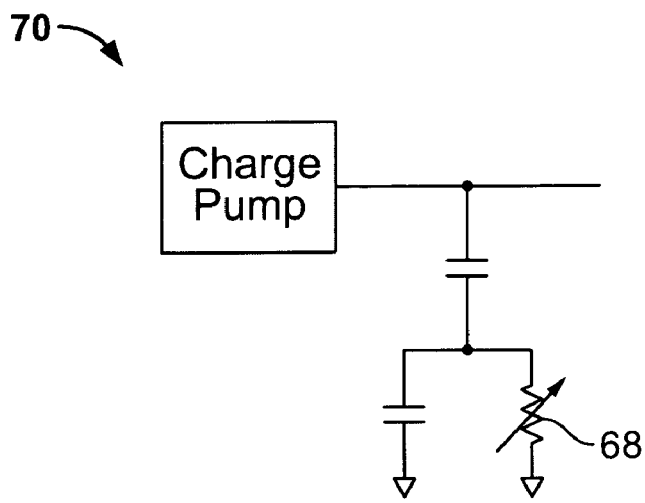
FIGS. 7D and 7E are electrical schematic diagrams of example circuits utilizing the circuit element of FIG. 7A in a phase compensation network in accordance with embodiments of the present invention.
Figure 7E:
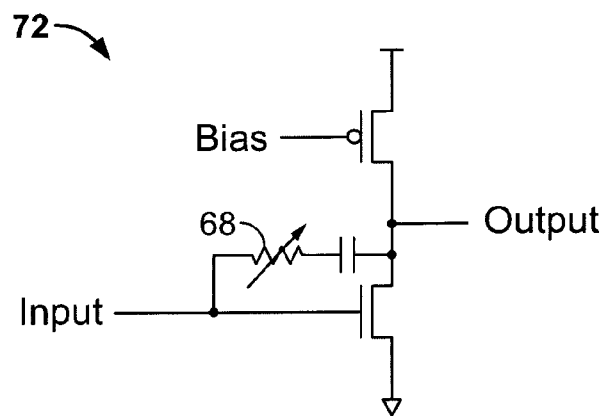

FIGS. 7D and 7E are electrical schematic diagrams of example circuits 70 and 72, respectively, utilizing the resistive circuit element 68 of FIG. 7A in a phase compensation network in accordance with embodiments of the present invention.

Figure 8A:
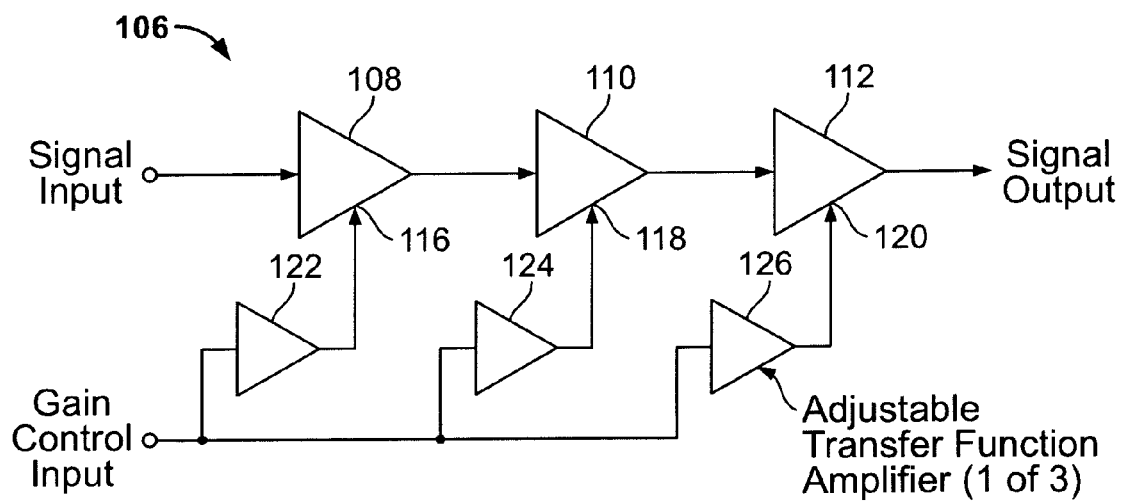
FIG. 8A is a system block diagram of a variable gain amplifier circuit having three adjustable transfer function amplifier elements in accordance with one embodiment of the present invention.

FIG. 8A is a system block diagram of a variable gain amplifier circuit having three adjustable transfer function amplifier elements in accordance with one embodiment of the present invention.

Figure 8B:
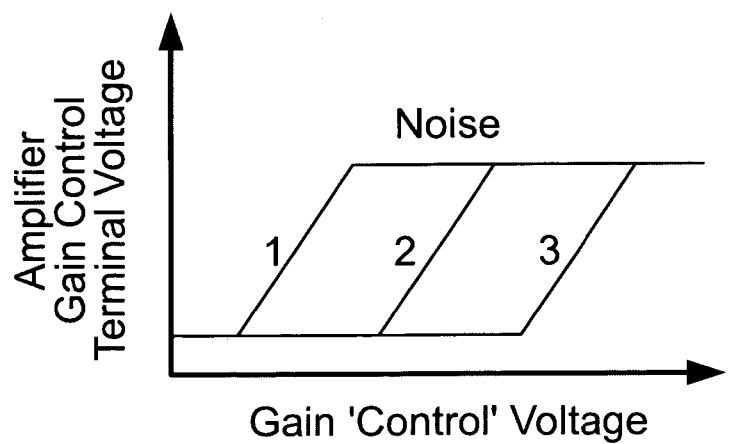
FIGS. 8B, 8C and 8D illustrate different transfer functions 1, 2 and 3 which the three adjustable transfer function elements of FIG. 8A may be programmed to perform as a function of charge stored on floating gates of their adjustable transfer function amplifier elements.
Figure 8C:
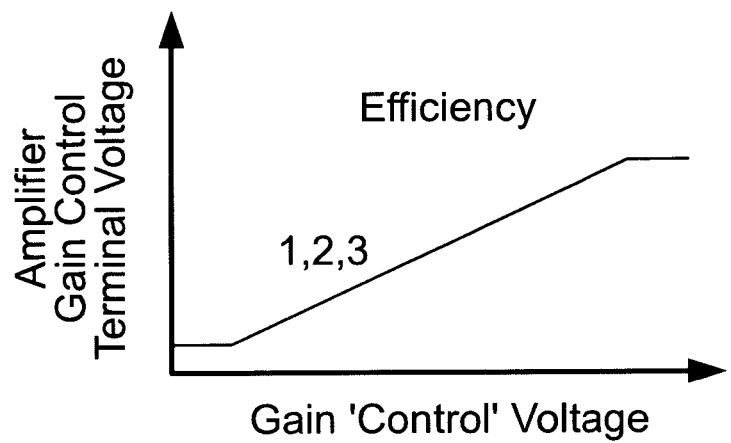
Figure 8D:
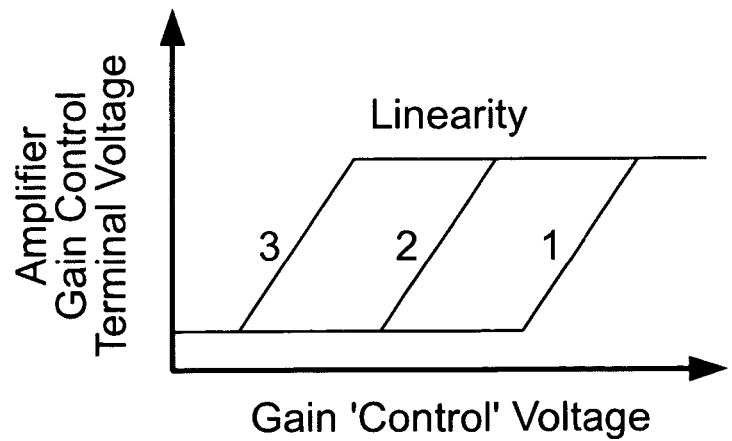

FIGS. 8B, 8C and 8D illustrate different transfer functions 1, 2 and 3 which the three adjustable transfer function elements of FIG. 8A may be programmed to perform as a function of charge stored on floating gates of their adjustable transfer function amplifier elements.

Figure 8E:
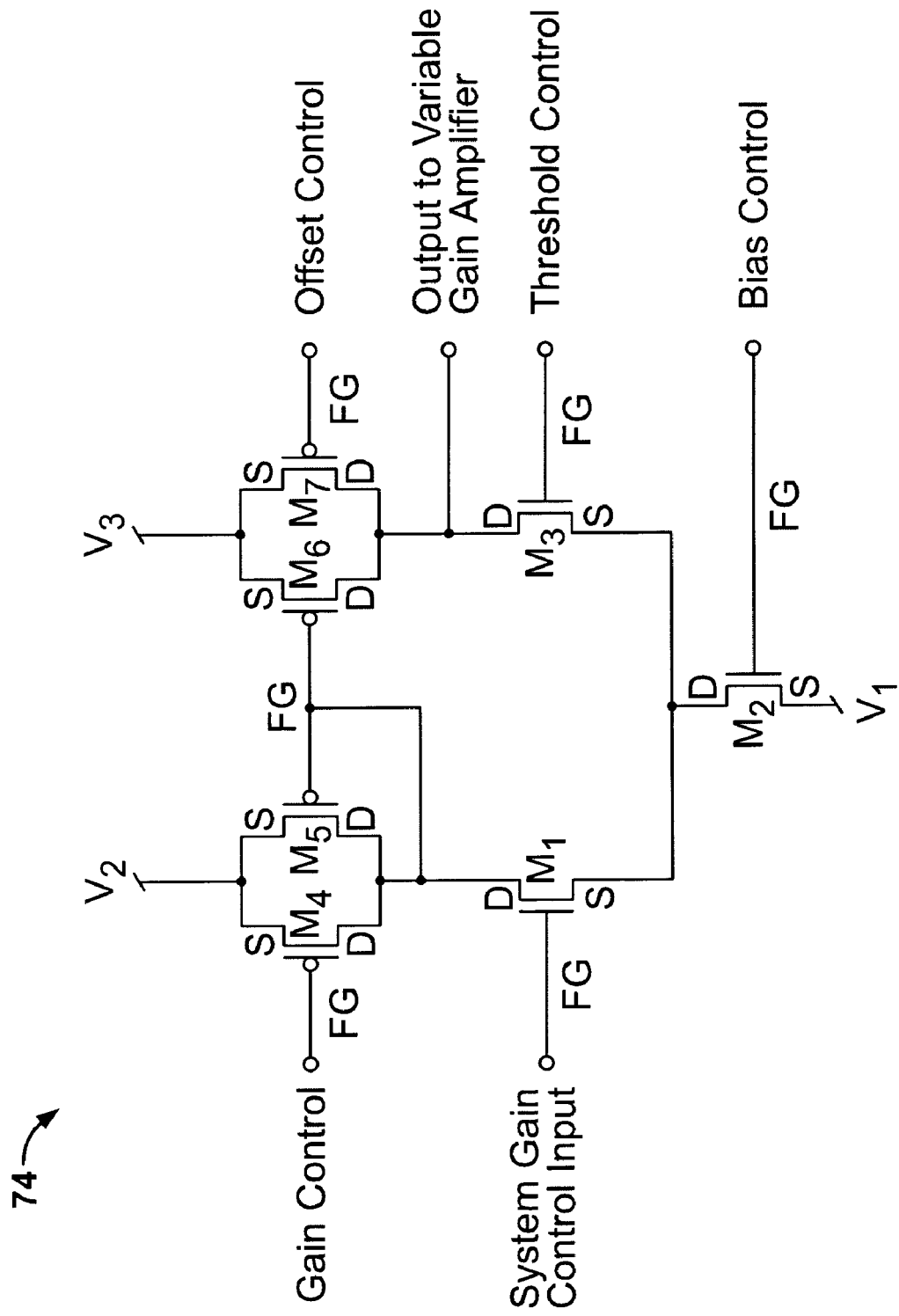
FIG. 8E is an electrical schematic diagram of an adjustable transfer function amplifier element in accordance with one embodiment of the present invention.

FIG. 8E is an electrical schematic diagram of an adjustable transfer function amplifier circuit element 74 in accordance with one embodiment of the present invention. Circuit element 74 uses analog-valued floating-gate MOSFETs to adjust bias currents of an amplifier with an active load, allowing the selection of an optimum bias point for given conditions of signal, mode and temperature.

FIG. 8A is a system block diagram of a variable gain amplifier circuit 106 constructed of three adjustable transfer function amplifier 108, 110, 112 to form a piecewise-constructed amplifier voltage transfer function. Each amplifier 108, 110, 112 may be constructed as in FIG. 8E where the charge on floating-gate MOSFETs controls the parameters of gain, offset, floating-gate threshold, system gain and bias. For example, amplifier 108 may be set up with the noise, efficiency and linearity characteristics illustrated for the reference number 1 curves in FIGS. 8B, 8C and 8D, respectively. Similarly, amplifier 110 may be set up to correspond to the reference number 2 curves and amplifier 112 may be set up to correspond to the reference number 3 curves. In this manner, floating gate MOSFETs are used to set the gain and offsets of a piecewise-constructed amplifier voltage transfer curve. The circuit's input/output response can thereby be matched to a desired linear or non-linear transfer function.

The variable-gain amplifier of FIG. 8A is an example of a serial signal processing system 106 which comprises a cascade of three similar amplifiers 108, 110, 112, each with controllable gain. The amplifiers 108, 110, and 112, have gain control input terminals 116, 118, and 120, respectively. The gain of a particular amplifier, expressed as the ratio of the signal voltage present at its output to the signal voltage present at its input, is a function of the voltage applied to its gain control input terminal. A single input 114 sets the overall gain of the system 106. System gain control input 114 connects to adjustable transfer function amplifiers 122, 124, 126, which drive gain control inputs of amplifiers 108, 110, 112 respectively. With this serial arrangement of amplifiers, a very wide range of gain control is possible. There are numerous tradeoffs to consider when designing the amplifier gain controls. The system may be optimized for various conditions by proper phasing of the gain control transfer functions. When operating a receiver under low-signal conditions in the absence of strong interference, it is best to maximize the gain in the early stages of the signal path in order to achieve best system noise performance. The transfer function graph in FIG. 8B, showing noise as the optimized parameter, depicts transfer functions with relatively high gain but with three different offsets. The offsets are established such that the gain of the first amplifier is maximized through most of the gain control range. As the first amplifier reaches maximum gain, the second amplifier is brought out of its minimum gain setting, and this repeats for the third amplifier. The result is a system gain that is a linear and continuous function of the gain control voltage, and system performance optimized for low noise. Similar considerations lead to different transfer function requirements depending on the application and operating environment. Transfer functions for two other cases, optimized for efficiency and linearity, are shown in FIGS. 8C and 8D, respectively. It is clear that these are just three out of the infinite number of possible transfer functions. The ability to adjust transfer functions in order to optimize system performance for given operating conditions enhances value and flexibility. Analog-valued floating-gate MOSFETs provide a means to achieve this adjustment ability. FIG. 8E is an electrical schematic diagram of a portion of one of the three adjustable transfer function amplifiers 122, 124, 126. Floating-gate MOSFETs are employed to control the threshold and gain of each amplifier by modifying the differential pair reference voltage, bias current, and output active load impedance. By controlling the amount of charge on each of the floating gates of a variable transfer function amplifier, it is possible for the amplifier to have an input voltage to output voltage transfer function with parameters suited to the particular application. Thus, each of the amplifiers 122, 124, 126 may have a unique response to a single input voltage presented to the gain control input 114.

Figure 9A:
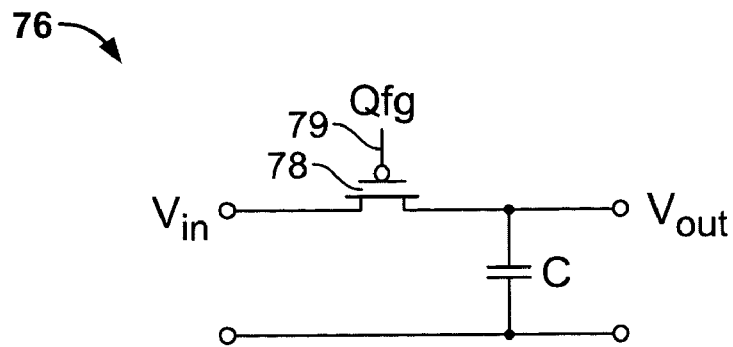
FIG. 9A is an electrical schematic diagram of a pFET-based trimmable R-C filter circuit in accordance with one embodiment of the present invention.

FIG. 9A is an electrical schematic diagram of a pFET-based trimmable R-C filter circuit element 76 in accordance with one embodiment of the present invention. Circuit element 76 includes a node, Vin, a floating-gate pFET 78 with a floating gate 79 acting as a variable MOS resistor, a capacitor, C, and a node, Vout.

Figure 9B:
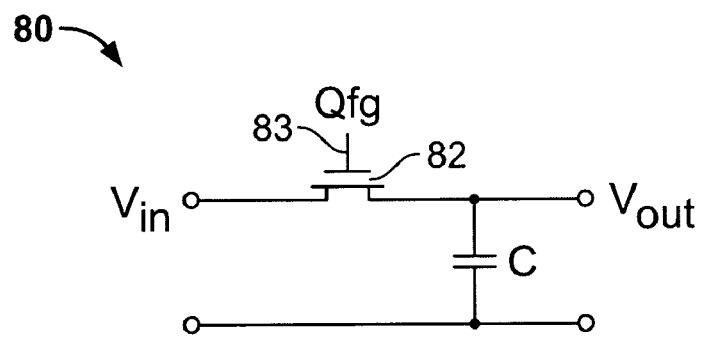
FIG. 9B is an electrical schematic diagram of an nFET-based trimmable R-C filter circuit in accordance with one embodiment of the present invention.

FIG. 9B is an electrical schematic diagram of an nFET-based trimmable R-C filter circuit element 80 having a node, Vin, a floating-gate nFET 82 with a floating gate 83, acting as a variable MOS resistor, a capacitor, C, and a node, Vout in accordance with one embodiment of the present invention.

Figure 9C:
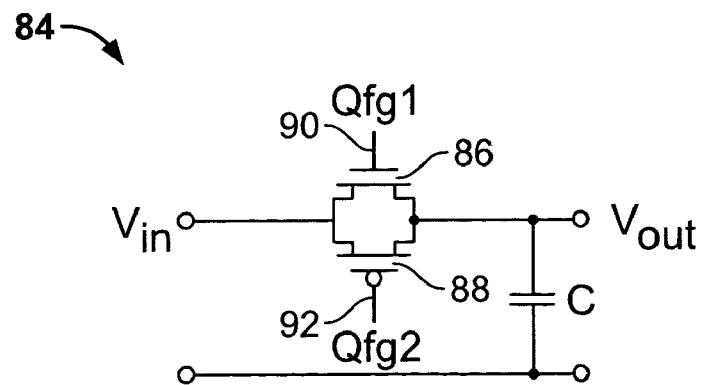
FIG. 9C is an electrical schematic diagram of an alternate trimmable R-C filter circuit utilizing both an NFET and a pFET in accordance with one embodiment of the present invention.

FIG. 9C is an electrical schematic diagram of an alternate trimmable R-C filter circuit element 84 utilizing both an NFET and a pFET in accordance with one embodiment of the present invention. Circuit element 84 includes a node, Vin, a floating-gate NFET 86 and a floating gate pFET 88 with floating gates 90 and 92, respectively, wired in parallel and acting as a variable MOS resistor, a capacitor, C, and a node Vout.

Figure 9D:
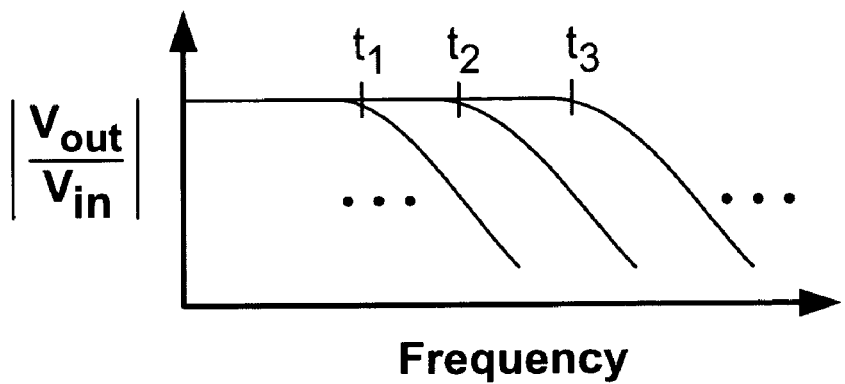
FIG. 9D is a plot of the absolute value of the output voltage divided by the input voltage vs. frequency for different levels of stored charge for circuit elements in accordance with FIGS. 9A, 9B and 9C.

These three versions of the trimmable R-C filter can be varied according to needs of either phase or frequency response. FIG. 9D is a plot of the absolute value of the voltage at node Vout dividend by the voltage at node Vin versus frequency for different levels of charge stored on the floating gate and illustrating the different frequency response of the circuits.

Figure 10A:
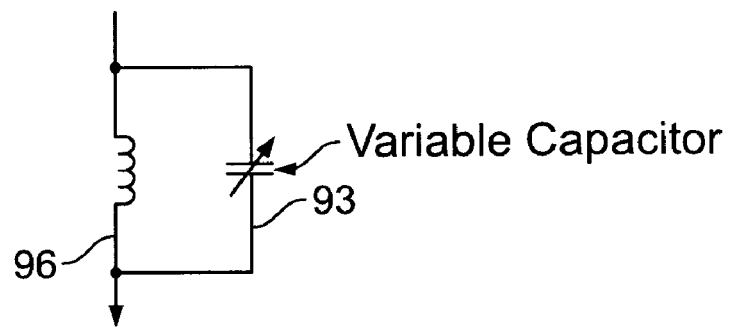
FIG. 10A is an electrical schematic diagram of a trimmable parallel L-C resonator circuit in accordance with one embodiment of the present invention.

FIG. 10A is an electrical schematic diagram of a trimmable parallel L-C resonator circuit element 94 in accordance with one embodiment of the present invention. Circuit element 94 includes an inductor 96 (fixed) wired in parallel with a MOSCAP variable capacitor 98. Circuit 94 can be varied in resonant frequency by adjusting the charge on the floating gate(s) of MOSCAP 98.

Figure 10B:
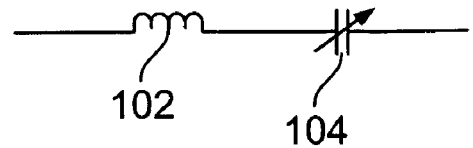
FIG. 10B is an electrical schematic diagram of a trimmable series L-C resonator circuit in accordance with one embodiment of the present invention.

FIG. 10B is an electrical schematic diagram of a trimmable series L-C resonator circuit 100 in accordance with one embodiment of the present invention. Circuit element 100 includes an inductor 102 (fixed) wired in series with a MOSCAP variable capacitor 104. Circuit 100 can be varied in resonant frequency by adjusting the charge in the floating gate(s) of MOSCAP 104.

Figure 10C:
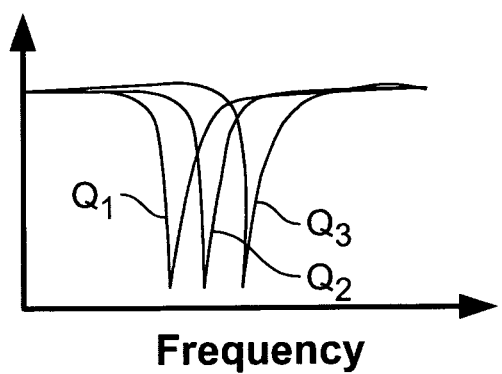
FIG. 10C is a plot of the magnitude of admittance vs. frequency for the parallel L-C resonator circuit of FIG. 10A and the impedance vs. frequency for the series L-C resonator circuit of FIG. 10B.

FIG. 10C is a plot of the magnitude of admittance vs. frequency for the parallel L-C resonator circuit element 94 of FIG. 10A and the impedance vs. frequency for the series L-C resonator circuit element 100 of FIG. 10B.

Figure 11A:
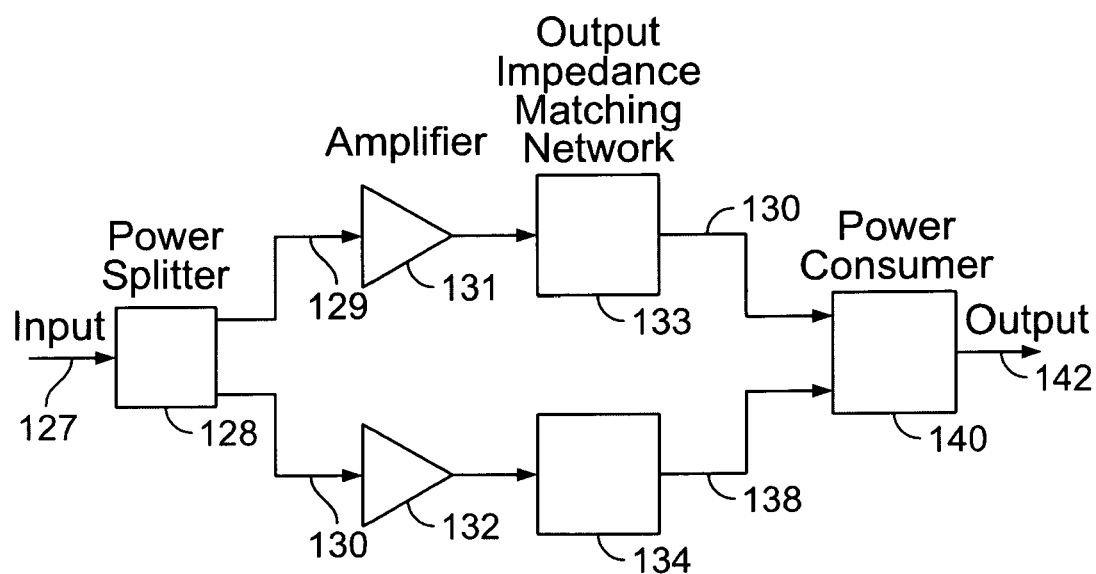
FIG. 11A is a system block diagram of a parallel radio frequency (RF) power amplifier system in accordance with one embodiment of the present invention.
Figure 11B:
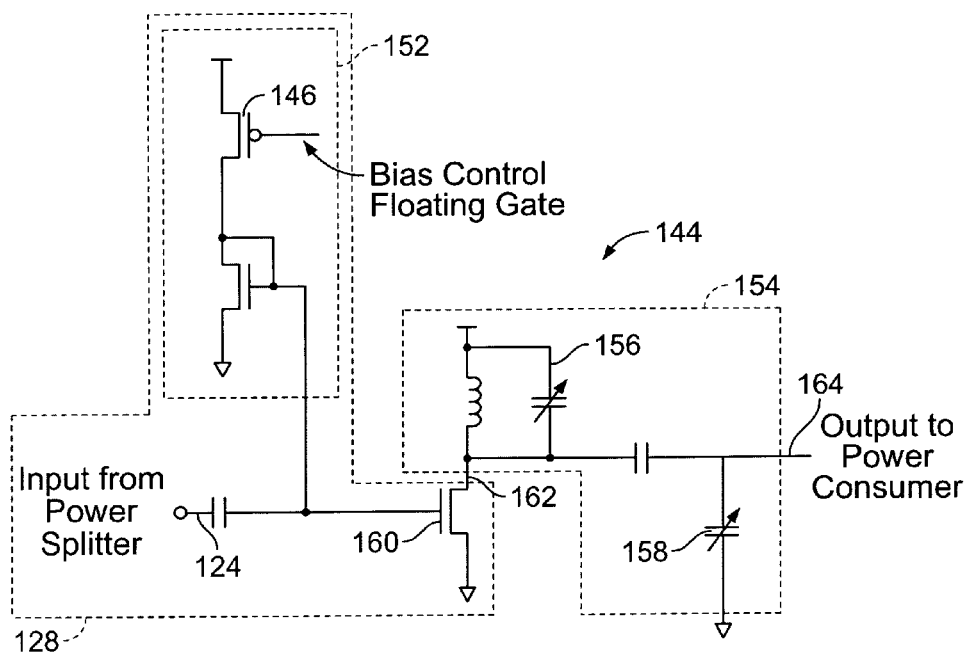
FIG. 11B is an electrical schematic diagram of a portion of the system of FIG. 11A in accordance with one embodiment of the present invention.

Turning now in detail to FIGS. 11A and 11B, FIG. 11A is a system block diagram of a parallel radio frequency (RF) power amplifier which takes an input signal at node 127, applies it to a power splitter 128 which splits the signal at node 127 into signals on nodes 129, 130 which are then passed to amplifiers 131, 132 and subsequently to output impedance matching networks 133, 134, respectively. They are then output on nodes 136, 138, respectively, to be combined in power combiner 140 which provides an output at node 142.

By combining the output power of two amplifiers, as illustrated in FIG. 11A, it is possible to construct a parallel amplifier system with greater output power capability than a single amplifier of the same type. In this parallel processing system, the input signal is divided equally and coupled into the two pathways. The parallel paths process signals that, ideally, are identical in every way. After amplification, the signals recombine to form the single high-power output. The efficiency of the overall system, and especially of the power combining operation, is dependent on the degree of matching between the parallel paths. The individual paths should exhibit the same gain, phase, and compression characteristics. Due to manufacturing variations, the two amplifiers will never be perfectly matched in all parameters, resulting in a degradation of system performance. Analog-valued floating-gate MOSFETs provide a means of adjustment of each of the parallel paths, enabling accurate matching of important parameters.

FIG. 11B is an electrical schematic diagram of a portion of one of the pathways 144 in the parallel power amplifier system of FIG. 11A. Floating gate transistors 146 are used to control the bias of the amplifier transistor, and to modify the output impedance matching network 154. A floating-gate controlled current mirror 152 establishes the bias voltage, enabling adjustments to minimize the effects of threshold variation. The output impedance matching network 154 uses two floating-gate controlled variable capacitors 156, 158. One of the variable capacitors 156 tunes the susceptance at the transistor 160 drain terminal 162 and the other variable capacitor 158 controls the shunt capacitance at the output 164. Adjusting these two capacitors 156, 158 changes the impedance presented to the drain 162 of the transistor 160. By controlling the bias voltage of transistor 160 and impedance matching characteristics of each of the amplifiers 131 and 132 independently, variations between the two paths may be tuned out, resulting in improved system performance. Note that variable capacitors 156, 158 may be implemented as MOSCAP variable capacitors in accordance with FIGS. 3A and/or 3B. Since the capacitors 156, 158 are part of the impedance matching network 154 which corresponds to networks 133, 134 of FIG. 11A, changing the capacitor values changes the load impedance presented to the drain of the amplifier transistor 160 and thus modifies the output impedance matching network 133, 134 of FIG. 11A.

Figure 12A:
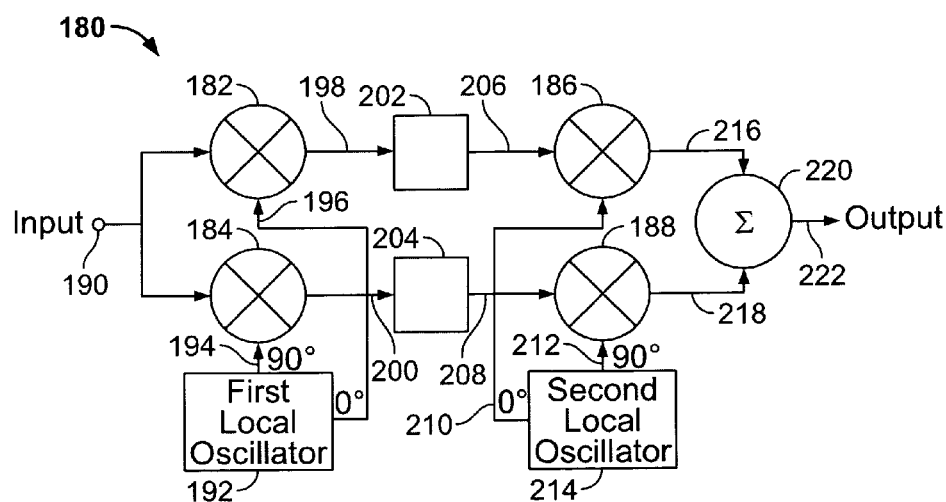
FIG. 12A is a system block diagram of a parallel-configured image-reject receiver in accordance with one embodiment of the present invention.
Figure 12B:
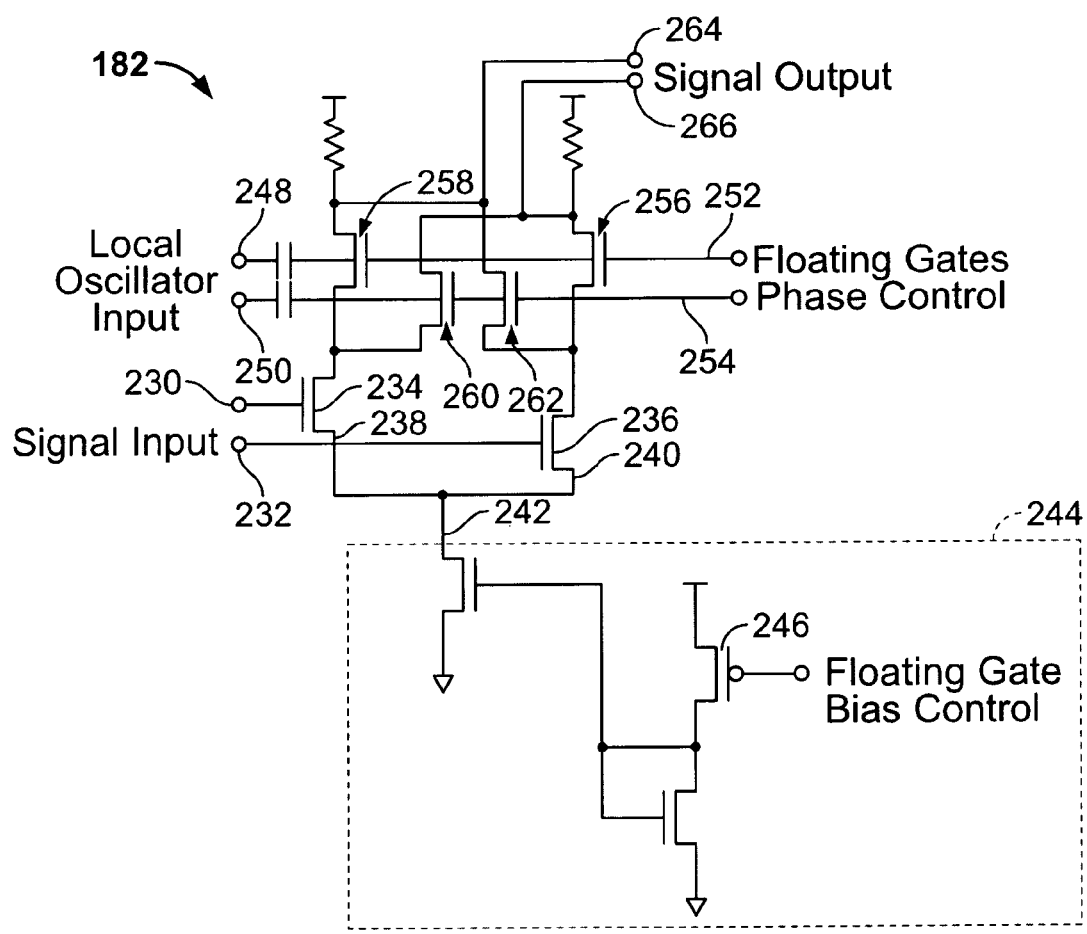
FIG. 12B is an electrical schematic diagram of a mixer circuit element as used in the system of FIG. 12A in accordance with one embodiment of the present invention.

Turning now to FIGS. 12A and 12B, FIG. 12A is a system block diagram of a parallel-configured image-reject receiver 180 featuring quadrature downconversion mixers 182, 184, 186, 188. A single input 190 provides a signal to two mixers 182, 184, each driven by the first local oscillator (LO) 192. The first LO 192 provides two outputs 194, 196 of the same frequency but differing in phase by 90 degrees. The input signal from node 190 mixes against the two phases of the first LO 192 in separate mixers 182, 184, forming two signals distinguished in phase on lines 198, 200, respectively. The signals may go through further processing stages, 202, 204, respectively, such as bandpass filters, before reaching the inputs 206, 208, respectively, of the second set of mixers 186, 188. Each of these signals mixes with one of the phases 210, 212 of a second LO 214, which also has two outputs 210, 212 differing by 90 degrees. The outputs 216, 218 of mixers 186, 188 are summed at summing junction 220 to form a final output 222. By using this technique, unwanted signals at the image frequency cancel, while signals at the desired frequency add. The ratio of the system gain at the desired frequency to the system gain at the image frequency, known as the image reject ratio (IRR), is strongly dependent on the accuracy of the LO phase and the gain match between the two signal paths. This ratio is related to phase error and gain mismatch by the following approximation:

$$IRR=20\ \log(2/(|1-\delta|+(\epsilon_1+\epsilon_2)))$$, where $\epsilon = Av_2/Av_1$ represents the fractional gain mismatch between paths, $\epsilon_1$ and $\epsilon_2$ represent quadrature phase error (in radians) of the first and second LO, respectively. $Av_1$ is the voltage gain of one of the signal pathways, defined as the ratio of the signal voltage at node 216 to the signal voltage at node 190 and $Av_2$ is the ratio of the signal voltage at node 218 to the signal voltage at node 190, for signals within the frequency band of interest. IRR is in decibels, and the gains are in linear units.

In practice, the two outputs of each LO will not be in perfect quadrature due to manufacturing variations and thermal effects. Gain of the two paths will be slightly different for the same reason. As phase departs from quadrature, and as gain mismatch grows, system performance rapidly degrades because of interference from the unwanted sideband. In order to optimize and maintain system performance, it is desirable to have the ability to adjust the gain of the signal paths and the phase of the LO signals.

FIG. 12B is an electrical schematic diagram of a mixer circuit 182 as used in FIG. 12A as mixer 182, 184, 186 or 188. Analog-valued floating-gate MOSFETs are used to provide adjustments for various components. The signal input enters at nodes 230, 232 which are coupled to the gates of nFETs 234, 236, respectively. The sources 238, 240 of nFETs 234, 236, respectively, are coupled together at node 242 and to a bias control circuit 244 which employs analog-valued floating-gate pFET 246 to control the bias current of the mixer 182 and hence, its gain. LO inputs enter at nodes 248, 250 and are capacitively coupled to floating gates 252, 254 respectively. Floating gates 252, 254 are part of nFETs 256, 258 and 260, 262, respectively. The LO signal and the signal input are mixed in nFETs 256, 258, 260, 262 and, in this manner, adjusting the charge on floating gates 252 and 254 controls the relative phase relationship between the signal input and the LO's. The mixed signals are output at nodes 264, 266.

Figure 13A:
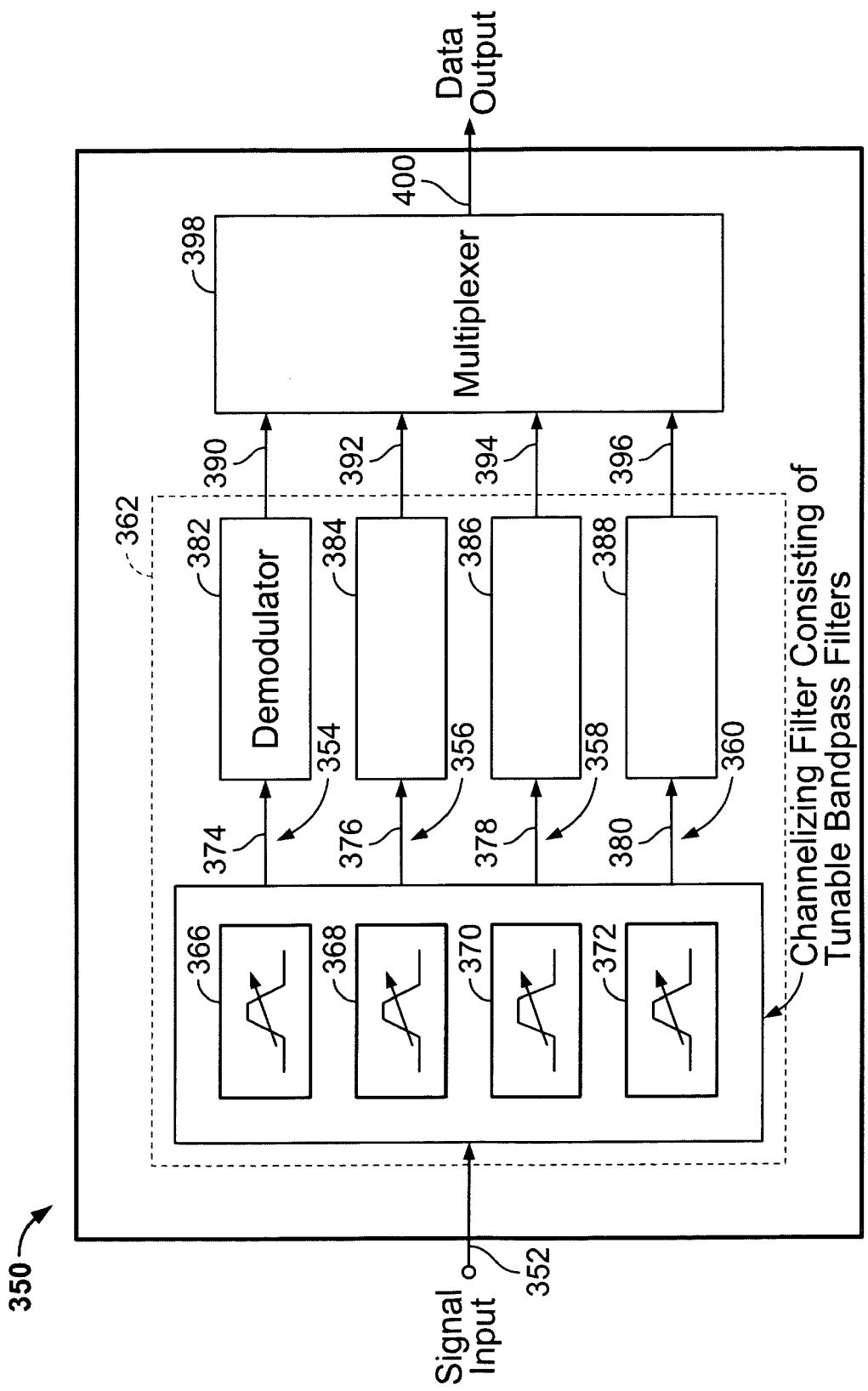
FIG. 13A is a system block diagram of a channelized receiver in accordance with one embodiment of the present invention.
Figure 13B:
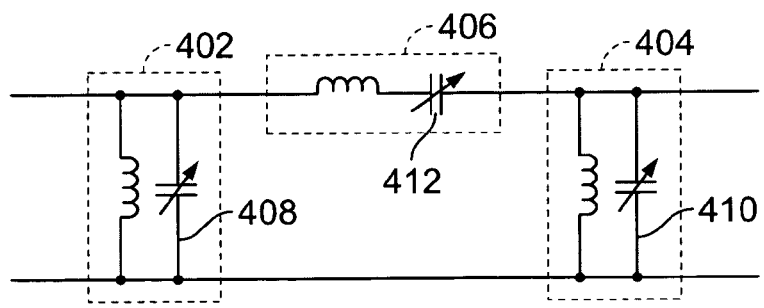
FIG. 13B is an electrical schematic diagram of an example channelizing filter band pass filter element as used in the receiver of FIG. 13A in accordance with one embodiment of the present invention.
Figure 13C:
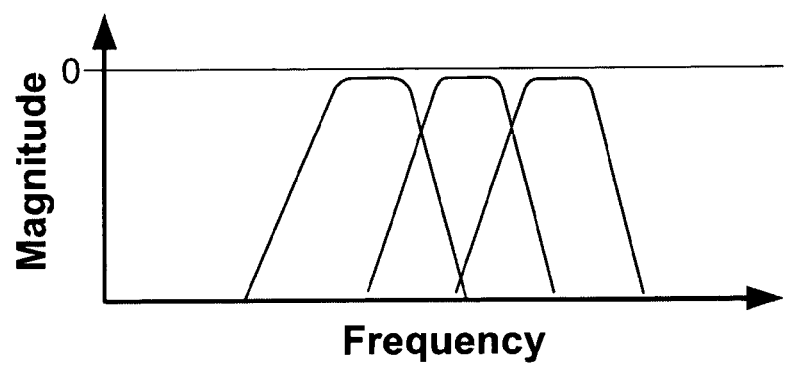
FIG. 13C is a plot of magnitude vs. frequency illustrating various response curves for bandpass filter elements as a function of charge stored on their respective floating gates.

Yet another example application of an embodiment of the present invention is a channelized receiver as shown in FIGS. 13A, 13B and 13C. FIG. 13A is a system block diagram of the channelized receiver 350. The receiver 350 takes in signal power spread over a wide range of frequencies. The first step in processing the incoming signal on node 352 is to separate the signal into components according to frequency. Each frequency component is referred to as a channel and the splitting process is called channel filtering. This process is typically performed in a fashion that enhances the ratio of desired channel power to noise and interference. Each channel is then processed by one of the signal pathways 354, 356, 358, 360 in a parallel processor configuration 362. Where a channelizing filter 364 comprising a plurality of individual band pass filters 366, 368, 370 372 splits the signal on input node 352 into individual frequency delimited signal bands on lines 374, 376, 378, 380, which are then passed to individual demodulator blocks 382, 384, 386, 388, respectively, which demodulate the channelized signals and then pass the demodulated signals on lines 390, 392, 394, 396, respectively, for further processing, as at multiplexer 398, and then on to output node 400.

The efficiency and accuracy of the processing performed on the individual channels are dependent on the frequency response characteristics of the channelizing filter 364. A high-quality, precisely tuned channel filter will maximize the power of the desired signal, while minimizing the power of interfering signals entering the receiver path, resulting in superior sensitivity and reduced distortion. If high-quality channel filters are available, then implementing a channelized receiver in a parallel system can result in a wide-bandwidth, high data rate system with enhanced efficiency and reduced circuit dynamic range requirements compared to a non-parallel implementation. Analog-valued floating-gate MOSFETs provide a means for constructing tunable filters which are capable of reducing effects of manufacturing variation, as well as adapting to changing temperature or signal conditions.

FIG. 13B is an electrical schematic diagram of an example channelizing filter band pass filter component (366, 368, 370 372) utilizing analog-valued floating gate MOSFETs. In accordance with an embodiment of the invention, the band pass filter comprises a pair of parallel L-C circuit elements 402, 404 coupled together with series L-C circuit element 406. Each capacitor 408, 410, 412 is a variable MOSCAP as described above.

FIG. 13C is a magnitude versus frequency response plot illustrating various response curves for bandpass filter components having different amounts of charge stored on their floating gates.

Using adjustable transistors to improve the performance of parallel or serial systems presents several advantages over other techniques.

The present invention is advantageous over the prior art process of laser trimming or fusible link formation/destruction because adjusting the transistors themselves allows continuous calibration during a circuit's life, whereas laser trimming or fusible links typically are one-time factory trims. Also, adjustable transistors are generally much smaller than trimmable resistors or fusible links, saving circuit area and in some cases increasing circuit speed and/or power consumption (trim resistors and fusible links have relatively large parasitic capacitance, requiring large currents to change their voltage rapidly).

The present invention is advantageous over using trim capacitors and/or dynamic element matching because floating-gate MOSFETs have near-zero charge leakage, so the update rates required to maintain calibration are set by circuit dynamics rather than by charge leakage. Update rates ranging from millihertz to kilohertz are supportable. By contrast, traditional trim capacitors have significant leakage that increases with temperature. Consequently, applications that use traditional trim capacitors require rapid trimming (i.e. kilohertz rates or faster), often causing high-frequency spurious signals that interfere with the signal of interest. Likewise, dynamic element matching, that randomizes mismatch errors by continually swapping elements into and out of different parts of a circuit, must also operate at rapid switching rates. If an application requires only a few trim devices, then rapid updates pose no major issue. However, if an application requires hundreds or thousands of trim devices, rapid updates aren't feasible due to the sheer number of updates required. Floating-gate devices have significant advantage in these applications.

The present invention is advantageous over prior art EEPROM (electrically eraseable programmable read-only memory), Flash Memory and similar memory devices because such memory, when used to store trimming information for analog circuits presents two disadvantages. First, because the stored information is digital, converting it into an analog quantity requires a DAC. Using a DAC to generate analog trim values consumes much more silicon die area than using analog-valued floating-gate MOSFETs. Second, because such memories store digital values, any updates to the trim information must also be digital and thereby may require an analog to digital converter (ADC) to store the information.

The present invention is advantageous over digital calibration. Digital calibration simply means tolerating any errors in the analog circuitry, and reducing the impact of these errors (digitally) at a later point in the system. For example, given an ADC with a transfer-function nonlinearity, digital calibration seeks to eliminate the nonlinearity by multiplying the ADC output by the inverse nonlinearity. Although this approach works in selected applications, a primary issue with analog errors is that they cause information loss, and no amount of digital correction can recover the lost information. For example, if an ADC has a missing code (a situation in which two of the ADC codewords overlap), then the ADC cannot resolve an analog value that falls at the missing code location regardless of any subsequent digital processing. By contrast, using analog-valued floating gates to trim the ADC to eliminate its missing code solves the problem completely.

The present invention is advantageous over intrinsic matching. Intrinsic matching is a well-known technique for eliminating transistor mismatch errors, and basically involves making the transistors in a system large enough so that any statistical errors are negligibly small compared with the large transistors. A clear disadvantage of large transistors is that they consume large silicon die area, and also tend to consume more power because designers put more current through them to compensate for the added parasitic capacitance. Using analog-valued floating-gate MOSFETs to dynamically improve transistor matching saves silicon die area and reduces power compared with static trimming.

While embodiments and applications of this invention have been shown and described, it will now be apparent to those skilled in the art having the benefit of this disclosure that many more modifications than mentioned above are possible without departing from the inventive concepts herein. For example, it is to be noted that while the present invention may be implemented in a single well single poly process and will work with low voltage processes (e.g., <=3 volts), the invention is not so limited and can be implemented in processes that support multiple polysilicon layers, multiple wells, and/or in higher voltage devices. The invention is also intended for use with single-ended signals as well as differential signals. Furthermore, the concept of an n-well as used herein is intended to encompass not only conventional n-well devices, but also NLDD (N-type Lightly Doped Drain) devices and other lightly doped, or isolated structures that increase the reliable gate-drain and drain-source voltages of the device so that it, in effect, behaves like a conventional n-well device in this respect. It may also be implemented in thin film above the substrate with equivalent thin film structures. Finally, those of ordinary skill in the art will now recognize that floating gate may be fabricated in a number of ways other than by using polycrystalline silicon. For example, they may be fabricated of metal or other suitable conductors. The invention, therefore, is not to be restricted except in the spirit of the appended claims.

What is claimed is:

1. An amplifier circuit, comprising:
   a signal input node;
   a signal output node;
   a p-channel floating gate transistor having a source, a drain and a floating gate; and
   an n-channel floating gate transistor having a source, a drain and a floating gate,
   wherein the source of the p-channel floating gate transistor is electrically coupled to a source of electrical power of a first electrical potential, the source of the n-channel floating gate transistor is electrically coupled to a source of electrical power of a second electrical potential, the drains of the p-channel floating gate transistor and the n-channel floating gate transistor are electrically coupled to said output node, and the floating gates of the n-channel floating gate transistor and the p-channel floating gate transistor are electrically coupled to said signal input node.

2. The amplifier circuit in accordance with claim 1, wherein the electrical coupling between the floating gates of the n-channel floating gate transistor, the p-channel floating gate transistor and said signal input node comprise a floating gate transistor having its floating gate electrically coupled to the floating gates of the n-channel floating gate transistor and the p-channel floating gate transistor and its source and drain electrically coupled together and to said signal input node.

3. The amplifier circuit in accordance with claim 1, wherein the floating gates of the n-channel floating gate transistor and the p-channel floating gate transistor are electrically coupled to said output node with a MOSCAP having a MOSCAP floating gate.

4. The amplifier circuit in accordance with claim 3, further comprising means for injecting electrons on to said MOSCAP floating gate.

5. The amplifier circuit in accordance with claim 4, further comprising means for tunneling electrons off of said MOSCAP floating gate.

6. The amplifier circuit in accordance with claim 5, wherein the electrical coupling between the floating gates of the n-channel floating gate transistor, the p-channel floating gate transistor and said signal input node comprises a floating gate transistor having its floating gate electrically coupled to the floating gates of the n-channel floating gate transistor and the p-channel floating gate transistor and its source and drain electrically coupled together and to said signal input node.

7. The amplifier circuit in accordance with claim 6, wherein:
   the floating gates of the n-channel floating gate transistor and the p-channel floating gate transistor are coupled to a first floating gate node.

8. The amplifier circuit in accordance with claim 7, further comprising:
   an injector disposed to inject electrons onto said first floating gate node.

9. The amplifier circuit in accordance with claim 8, further comprising:
   a tunneling junction disposed to remove electrons from said first floating gate node.

10. The amplifier circuit in accordance with claim 9, wherein the electrical coupling between the floating gates of the n-channel floating gate transistor, the p-channel floating gate transistor and said signal input node comprise a floating gate transistor having its floating gate electrically coupled to the floating gates of the n-channel floating gate transistor and the p-channel floating gate transistor and its source and drain electrically coupled together and to said signal input node.

11. The amplifier circuit in accordance with claim 10, wherein the floating gates of the n-channel floating gate transistor and the p-channel floating gate transistor are electrically coupled to said output node with a MOSCAP having a MOSCAP floating gate.

* * * * *